(12) United States Patent
Asaoka et al.

(10) Patent No.: US 12,414,436 B2
(45) Date of Patent: Sep. 9, 2025

(54) DISPLAY DEVICE

(71) Applicant: SHARP KABUSHIKI KAISHA, Osaka (JP)

(72) Inventors: Yasushi Asaoka, Sakai (JP); Sentaro Kida, Sakai (JP); Jun Sakuma, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 616 days.

(21) Appl. No.: 17/790,706

(22) PCT Filed: Jan. 6, 2020

(86) PCT No.: PCT/JP2020/000022
§ 371 (c)(1),
(2) Date: Jul. 1, 2022

(87) PCT Pub. No.: WO2021/140535
PCT Pub. Date: Jul. 15, 2021

(65) Prior Publication Data
US 2023/0057673 A1    Feb. 23, 2023

(51) Int. Cl.
*H10K 59/121* (2023.01)
*H10H 20/831* (2025.01)
(Continued)

(52) U.S. Cl.
CPC ......... *H10K 59/121* (2023.02); *H10H 20/831* (2025.01); *H10H 20/833* (2025.01);
(Continued)

(58) Field of Classification Search
CPC ... H10K 59/122; H10K 59/124; H10K 59/128
See application file for complete search history.

(56) References Cited

U.S. PATENT DOCUMENTS

2004/0227698 A1   11/2004   Yamazaki et al.
2005/0258744 A1   11/2005   Kwak et al.
(Continued)

FOREIGN PATENT DOCUMENTS

CN    102044554 A    5/2011
JP    2005038608 A   2/2005
(Continued)

*Primary Examiner* — Evan G Clinton
(74) *Attorney, Agent, or Firm* — ScienBiziP, P.C.

(57) ABSTRACT

A display device includes: a substrate; a flattened layer; at least one first light-emitting element; at least one second light-emitting element; at least one first drive circuit; and at least one second drive circuit, wherein light emitted by the first light-emitting element is taken out through the substrate, light emitted by the second light-emitting element is taken out from a direction opposite to a direction in which the light emitted by the first light-emitting element is taken out, the first light-emitting element is provided in an opening provided in the flattened layer, the second light-emitting element is provided in a layer above the flattened layer and overlaps the flattened layer, and the first drive circuit and the second drive circuit are provided closer to the substrate than the second light-emitting element.

20 Claims, 16 Drawing Sheets

(51) Int. Cl.
  *H10H 20/832* (2025.01)
  *H10H 20/833* (2025.01)
  *H10H 20/851* (2025.01)
  *H10H 20/857* (2025.01)
  *H10H 29/14* (2025.01)
  *H10K 59/124* (2023.01)
(52) U.S. Cl.
  CPC ...... *H10H 20/835* (2025.01); *H10H 20/8514* (2025.01); *H10H 20/857* (2025.01); *H10H 29/142* (2025.01); *H10K 59/124* (2023.02)

(56) References Cited

U.S. PATENT DOCUMENTS

| | | |
|---|---|---|
| 2005/0269941 A1 | 12/2005 | Kim et al. |
| 2006/0066229 A1 | 3/2006 | Nimura |
| 2009/0051285 A1* | 2/2009 | Kajiyama ............. H10K 50/85 |
| | | 313/506 |
| 2011/0205198 A1* | 8/2011 | Jeong .................... H10K 50/81 |
| | | 345/82 |
| 2015/0048999 A1 | 2/2015 | Hsieh |
| 2016/0181332 A1* | 6/2016 | Park ..................... H10K 59/878 |
| | | 257/88 |
| 2017/0148860 A1* | 5/2017 | Park ..................... H10K 50/844 |

FOREIGN PATENT DOCUMENTS

| | | |
|---|---|---|
| JP | 2005338769 A | 12/2005 |
| JP | 2005347269 A | 12/2005 |
| JP | 2006128077 A | 5/2006 |
| JP | 2009054328 A | 3/2009 |
| KR | 20140084603 A | 7/2014 |

* cited by examiner

DISPLAY DEVICE

TECHNICAL FIELD

The disclosure relates to a display device, in particular a double-sided display device.

BACKGROUND ART

In recent years, various display devices including a light-emitting element have been developed. Particularly, a display device including an organic light emitting diode (OLED) and a display device including an inorganic light-emitting diode or a quantum dot light emitting diode (QLED) have drawn a great deal of attention because these devices offer advantages such as lower power consumption, smaller thickness, and higher picture quality.

For example, as described in Patent Literature (PTL) 1 below, in the field of display devices provided with light-emitting elements, development of display devices for enabling simultaneous display of different images on the front and back sides has been actively performed.

CITATION LIST

Patent Literature

PTL 1: JP 2006-128077 A (published May 18, 2006)

SUMMARY

Technical Problem

PTL 1 describes a double-sided display device including both a top emission light-emitting element and a bottom emission light-emitting element on a flattened layer. In a case of the top emission light-emitting element, a light blocking layer having light reflectivity is provided between the light-emitting layer provided in the top emission light-emitting element and the flattened layer in order to take out light on an opposite side of the flattened layer side, and in a case of the bottom emission light-emitting element, a light blocking layer having light reflectivity is provided in a layer above the light-emitting layer provided in the bottom emission light-emitting element in order to take out light on the flattened layer side.

According to the configuration described above, the double-sided display device can be implemented, but since both the top emission light-emitting element and the bottom emission light-emitting element are provided on the flattened layer, the following problem exists.

The top emission light-emitting element needs to be electrically connected to a drive circuit that controls the light emission intensity of the top emission light-emitting element, and the bottom emission light-emitting element needs to be electrically connected to a drive circuit that controls the light emission intensity of the bottom emission light-emitting element.

Thus, in the case of the above-described configuration, it is necessary to form both a first contact hole for electrically connecting the top emission light-emitting element and the drive circuit that controls the light emission intensity of the top emission light-emitting element, and a second contact hole for electrically connecting the bottom emission light-emitting element and the drive circuit that controls the light emission intensity of the bottom emission light-emitting element, in the flattened layer.

As described above, when a large number of contact holes such as the first contact holes and the second contact holes are formed in the flattened layer, the region on the flattened layer on which the top emission light-emitting element and the bottom emission light-emitting element can be formed is narrowed by the region in which the contact holes are formed.

Thus, in the case of the double-sided display device described in PTL 1, it is difficult to secure a sufficient light-emitting region.

An aspect of the disclosure has been made in view of the above-described problem, and an object of the disclosure is to provide a display device provided with a bottom emission light-emitting element having a wider light-emitting region.

Solution to Problem

In order to solve the problem described above, the display device according to an embodiment of the disclosure includes a substrate, a flattened layer formed on one side of the substrate, at least one first light-emitting element, at least one second light-emitting element, at least one first drive circuit configured to control light emission intensity of the first light-emitting element, and at least one second drive circuit configured to control light emission intensity of the second light-emitting element, in which light emitted by the first light-emitting element is taken out through the substrate, light emitted by the second light-emitting element is taken out from a direction opposite to a direction in which the light emitted by the first light-emitting element is taken out, the first light-emitting element is provided in an opening provided in the flattened layer, the second light-emitting element is provided in a layer above the flattened layer and overlaps the flattened layer, and the first drive circuit and the second drive circuit are provided closer to the substrate than the second light-emitting element.

Advantageous Effects of Disclosure

According to an aspect of the disclosure, it is possible to provide a display device including a bottom emission light-emitting element having a wider light-emitting region.

DESCRIPTION OF EMBODIMENTS

Embodiments of the disclosure will be described with reference to FIGS. 1 to 17 as follows. Hereinafter, for convenience of explanation, components having the same functions as those described in a specific embodiment are appended with the same reference signs, and descriptions thereof may be omitted.

First Embodiment

Figure 1:
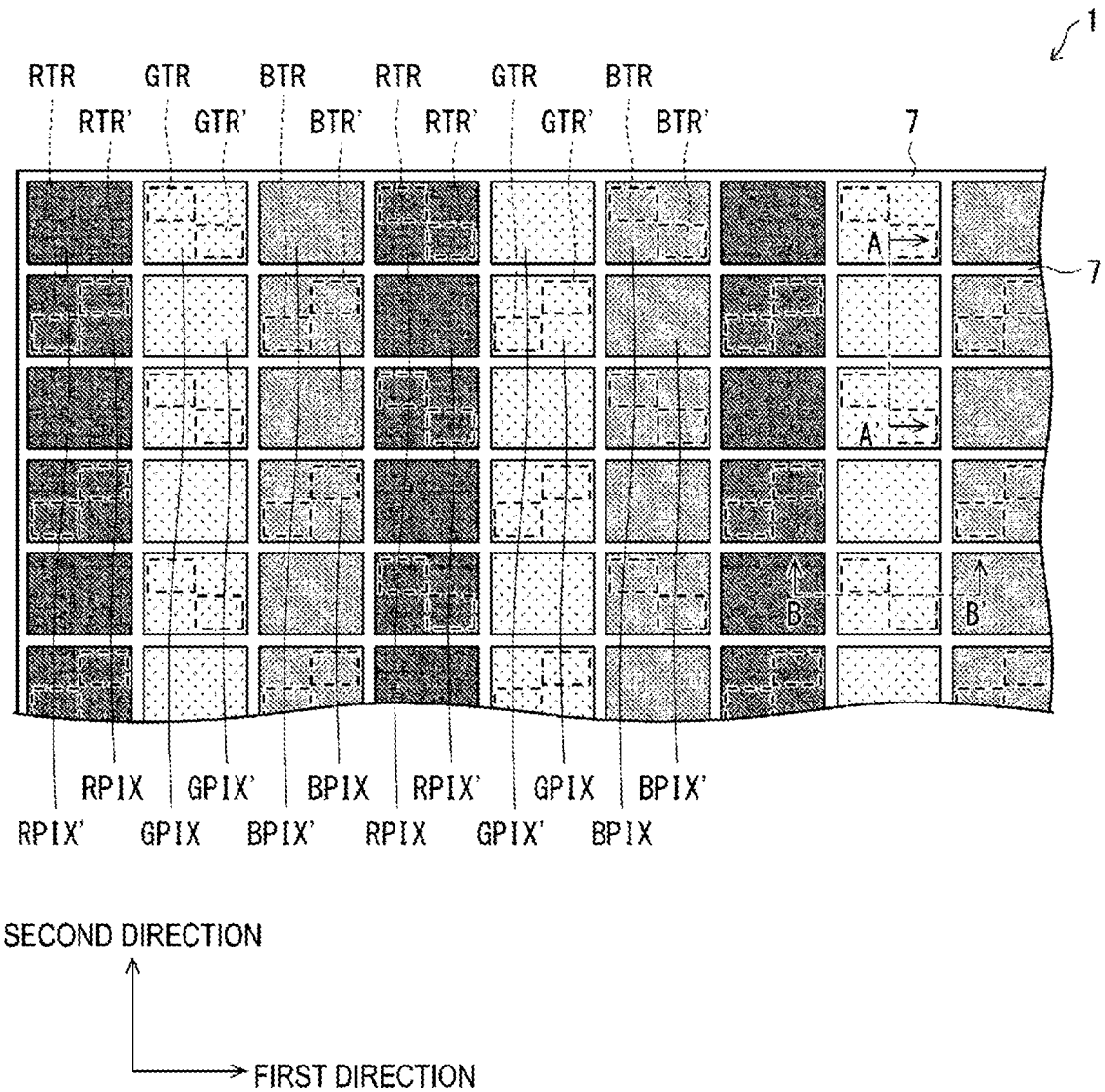
FIG. 1 is a plan view illustrating a display region of a display device according to a first embodiment.

FIG. 1 is a plan view illustrating a display region of a display device 1 according to a first embodiment.

As illustrated in FIG. 1, the display region of the display device 1 includes a first light-emitting region including a red pixel for bottom emission (hereinafter referred to as a red pixel for BE) RPIX' and a red pixel for top emission (hereinafter referred to as a red pixel for TE) RPIX, which are adjacent to each other in a second direction in the figure, a second light-emitting region including a green pixel for bottom emission (hereinafter referred to as a green pixel for BE) GPIX' and a green pixel for top emission (hereinafter referred to as a green pixel for TE) GPIX, which are adjacent to each other in the second direction, and a third light-emitting region including a blue pixel for bottom emission (hereinafter referred to as a blue pixel for BE) BPIX' and a blue pixel for top emission (hereinafter referred to as a blue pixel for TE) BPIX, which are adjacent to each other in the second direction. The first light-emitting region, the second light-emitting region, and the third light-emitting region are arranged adjacent to each other in a first direction in the figure.

Then, the red pixel RPIX' for BE, the green pixel GPIX' for BE, and the blue pixel BPIX' for BE, in the first light-emitting region, the second light-emitting region, and the third light-emitting region, which are arranged adjacent to each other in the first direction, are one display unit for bottom emission.

In addition, the red pixel RPIX for TE, the green pixel GPIX for TE, and the blue pixel BPIX for TE, in the first light-emitting region, the second light-emitting region, and the third light-emitting region, which are arranged adjacent to each other in the first direction, are one display unit for top emission.

Here, one display unit is a minimum unit capable of displaying all colors of the color coordinates that can be expressed by the display device 1.

In the embodiment, a case in which the number of display units for bottom emission and the number of display unit for top emission are the same, that is, the resolution of a back side display surface and the resolution of a front side display surface are the same, will be described as an example. However, without being limited to having the same resolution, the resolution of the back side display surface and the resolution of the front side display surface may be different, as will be described later.

As illustrated in FIG. 1, a plurality of the first light-emitting regions, a plurality of the second light-emitting regions, and a plurality of the third light-emitting regions are each arranged linearly along the second direction. That is, the plurality of red pixels, the plurality of green pixels, and the plurality of blue pixels are each arranged along a straight line extending in the second direction for each color.

Further, as illustrated in FIG. 1, in the first direction, the bottom emission pixels are arranged so as to be adjacent to the top emission pixels having different colors. That is, in the first direction, the top emission pixels are arranged so as to be adjacent to the bottom emission pixels having different colors.

As illustrated in FIG. 1, the first light-emitting region is provided with a first drive circuit RTR' and a second drive circuit RTR for driving the first light-emitting region, the second light-emitting region is provided with a first drive circuit GTR' and a second drive circuit GTR for driving the second light-emitting region, and the third light-emitting region is provided with a first drive circuit BTR' and a second drive circuit BTR for driving the third light-emitting region.

Note that, as illustrated in FIG. 1, the red pixel RPIX' for BE, the green pixel GPIX' for BE, the blue pixel BPIX' for BE, the red pixel RPIX for TE, the green pixel GPIX for TE, and the blue pixel BPIX for TE are surrounded by an edge cover 7 in a frame-like shape.

Figure 3:
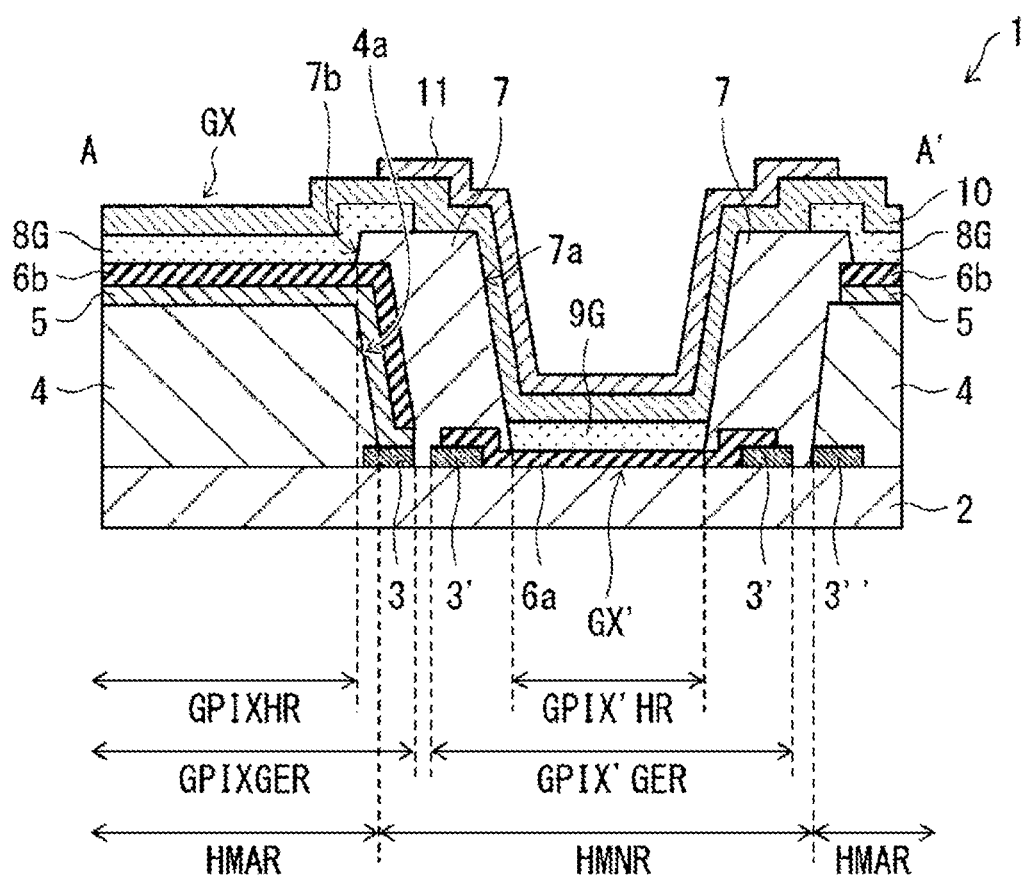
FIG. 3 is a cross-sectional view taken along a line A-A' of the display device according to the first embodiment illustrated in FIG. 1.

FIG. 3 is a cross-sectional view taken along a line A-A' of the display device 1 according to the first embodiment illustrated in FIG. 1.

Figure 4:
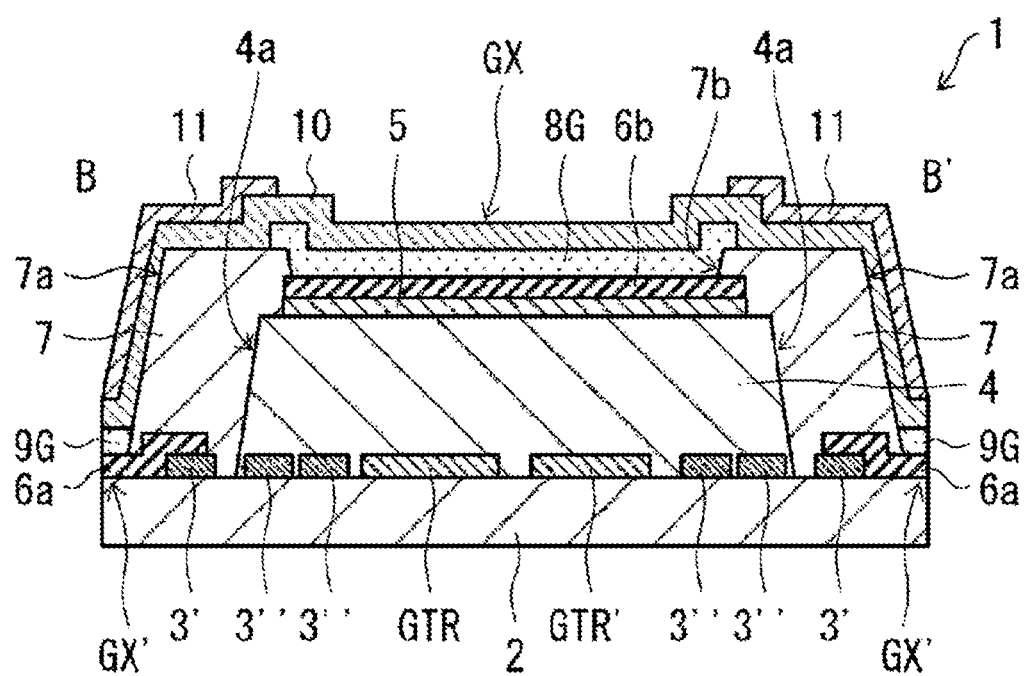
FIG. 4 is a cross-sectional view taken along a line B-B' of the display device according to the first embodiment illustrated in FIG. 1.

FIG. 4 is a cross-sectional view taken along a line B-B' of the display device 1 according to the first embodiment illustrated in FIG. 1.

As illustrated in FIGS. 3 and 4, the display device 1 includes a substrate 2, a flattened layer 4 formed on one side of the substrate 2 (in the embodiment, an upper face of the substrate 2), a first green light-emitting element (first light-emitting element) GX', a second green light-emitting element (second light-emitting element) GX, the first drive circuit GTR' that controls the light emission intensity of the first green light-emitting element (first light-emitting element) GX', and the second drive circuit GTR that controls the light emission intensity of the second green light-emitting element (second light-emitting element) GX. Although not illustrated in FIGS. 3 and 4, the display device 1 further includes a first red light-emitting element (first light-emitting element) RX', a first blue light-emitting element (first light-emitting element) BX', a second red light-emitting element (second light-emitting element) RX, a second blue light-emitting element (second light-emitting element) BX, the first drive circuit RTR' that controls the light emission intensity of the first red light-emitting element (first light-emitting element) RX', the first drive circuit BTR' that controls the light emission intensity of the first blue light-emitting element (first light-emitting element) BX', the second drive circuit RTR that controls the light emission intensity of the second red light-emitting element (second light-emitting element) RX, and the second drive circuit BTR that controls the light emission intensity of the second blue light-emitting element (second light-emitting element) BX (see FIG. 2).

As illustrated in FIGS. 3 and 4, in the display device 1, light emitted by the first green light-emitting element GX' is taken out through the substrate 2, and light emitted by the second green light-emitting element GX is taken out from a direction opposite to a direction in which the light emitted by the first green light-emitting element GX' is taken out.

The first green light-emitting element GX' is provided in an opening 4a provided in the flattened layer 4, and the second green light-emitting element GX is provided in a layer above the flattened layer 4 so as to overlap the flattened layer 4. Note that, each of the first red light-emitting element RX' and the first blue light-emitting element BX', not illustrated in the figure, is similarly provided in each of the openings 4a provided in the flattened layer 4, and each of the second red light-emitting element RX and the second blue light-emitting element BX, not illustrated in the figure, is similarly provided in the layer above the flattened layer 4 so as to overlap the flattened layer 4.

As described above, the flattened layer 4 is formed so as to cover regions other than the light-emitting regions of the first red light-emitting element (first light-emitting element) RX', the first green light-emitting element (first light-emitting element) GX', and the first blue light-emitting element (first light-emitting element) BX'. As the flattened layer 4, a positive or negative photosensitive resin is preferably used, and a film thickness thereof is preferably 1 µm or greater. Note that as long as the opening 4a can be formed, a resin that is not photosensitive may be used.

As illustrated in FIG. 4, the first drive circuit GTR' that controls the light emission intensity of the first green light-emitting element (first light-emitting element) GX' and the second drive circuit GTR that controls the light emission intensity of the second green light-emitting element (second light-emitting element) GX are provided closer to the substrate 2 than the second green light-emitting element (second light-emitting element) GX. Further, although not illustrated, the first drive circuit RTR' that controls the light emission intensity of the first red light-emitting element (first light-emitting element) RX' and the second drive circuit RTR that controls the light emission intensity of the second red light-emitting element (second light-emitting element) RX are also provided closer to the substrate 2 than the second red light-emitting element (second light-emitting element) RX. Furthermore, although not illustrated, the first drive circuit BTR' that controls the light emission intensity of the first blue light-emitting element (first light-emitting element) BX' and the second drive circuit BTR that controls the light emission intensity of the second blue light-emitting element (second light-emitting element) BX are also provided closer to the substrate 2 than the second blue light-emitting element (second light-emitting element) BX.

As illustrated in FIGS. 3 and 4, the first green light-emitting element (first light-emitting element) GX' includes, in order from the substrate 2 side, a transparent conductor 6a, which is an island-shaped first pixel electrode, a green light-emitting layer (first light-emitting layer) 9G, and a transparent conductor 10, which is a common electrode (first common electrode). Then, in order to take out the light emitted by the first green light-emitting element GX' through the substrate 2, that is, to implement a bottom emission light-emitting element, the first light blocking member 11 is provided on a side of the green light-emitting layer (first light-emitting layer) 9G opposite to the substrate 2. Note that, although not illustrated in the figure, the first red light-emitting element (first light-emitting element) RX' (see FIG. 2) has a configuration similar to that of the first green light-emitting element (first light-emitting element) GX' described above, except that the first red light-emitting element (first light-emitting element) RX' includes a red light-emitting layer as a light-emitting layer, and the first blue light-emitting element (first light-emitting element) BX' (see FIG. 2) has a configuration similar to that of the first green light-emitting element (first light-emitting element) GX' described above, except that the first blue light-emitting element (first light-emitting element) BX' includes a blue light-emitting layer as a light-emitting layer.

On the other hand, as illustrated in FIGS. 3 and 4, the second green light-emitting element (second light-emitting element) GX includes, in order from the substrate 2 side, a transparent conductor 6b, which is an island-shaped second pixel electrode, a green light-emitting layer (second light-emitting layer) 8G, and a transparent conductor 10, which is a common electrode (second common electrode). In order to take out the light emitted by the second green light-emitting element GX from the direction opposite to the direction in which the light emitted by the first green light-emitting element GX' is taken out, that is, to implement a top emission light-emitting element, the second light blocking member 5 is provided on the substrate 2 side of the green light-emitting layer (second light-emitting layer) 8G. Note that, although not illustrated in the figure, the second red light-emitting element (second light-emitting element) RX (see FIG. 2) has a configuration similar to that of the second green light-emitting element (second light-emitting element) GX described above, except that the second red light-emitting element (second light-emitting element) RX includes a red light-emitting layer as a light-emitting layer, and the second blue light-emitting element (second light-emitting element) BX (see FIG. 2) also has a configuration similar to that of the second green light-emitting element (second light-emitting element) GX described above, except that the second blue light-emitting element (second light-emitting element) BX includes a blue light-emitting layer as a light-emitting layer.

As illustrated in FIGS. 3 and 4, the edge cover 7 is provided so as to overlap an edge portion of the transparent conductor 6a, which is the island-shaped first pixel electrode, and an edge portion of the transparent conductor 6b, which is the island-shaped second pixel electrode. The edge cover 7 has a first opening 7a that overlaps the transparent conductor 6a, which is the island-shaped first pixel electrode, and has a second opening 7b that overlaps the transparent conductor 6b, which is the island-shaped second pixel electrode. An edge of the first opening 7a in the edge cover 7 is located inside an edge of the opening 4a in the flattened layer 4. The edge of the first opening 7b in the edge cover 7 overlaps the flattened layer 4.

In the embodiment, as described above, a case in which the edge of the first opening 7a in the edge cover 7 is located inside the edge of the opening 4a in the flattened layer 4 will be described as an example. However, without being limited to this case, the edge of the first opening 7a in the edge cover 7 may be located outside the edge of the opening 4a in the flattened layer 4, as in a modified example described later.

Further, in the embodiment, a case in which the edge cover 7 is one edge cover layer formed of the same material is described as an example. However, without being limited to this case, an edge cover overlapping the edge portion of the transparent conductor 6a, which is the island-shaped first pixel electrode, and an edge cover overlapping the edge portion of the transparent conductor 6b, which is the island-shaped second pixel electrode, may be different layers formed of different materials.

Note that, the edge cover 7 may be made of a positive or negative photosensitive resin, or may be made by patterning by etching a non-photosensitive inorganic insulating film with a resist film having a predetermined shape.

As illustrated in FIG. 3, a light-emitting region GPIX'HR of the first green light-emitting element (first light-emitting element) GX' is a region in which the transparent conductor 6a, which is the island-shaped first pixel electrode, the green light-emitting layer (first light-emitting layer) 9G, and the transparent conductor 10, which is the common electrode (first common electrode), provided in the first green light-emitting element (first light-emitting element) GX', overlap each other, and corresponds to the green pixel GPIX' for BE illustrated in FIG. 1.

Note that a first pixel electrode formation region GPIX-'GER illustrated in FIG. 3 is a formation region of the transparent conductor 6a, which is the island-shaped first pixel electrode, provided in the first green light-emitting element (first light-emitting element) GX'.

Although not illustrated in the figure, a light-emitting region of the first red light-emitting element (first light-emitting element) RX' (see FIG. 2) is a region in which the transparent conductor 6a, which is the island-shaped first pixel electrode, the red light-emitting layer (first light-emitting layer), and the transparent conductor 10, which is the common electrode (first common electrode), provided in the first red light-emitting element (first light-emitting element) RX', overlap each other, and corresponds to the red pixel RPIX' for BE illustrated in FIG. 1. Similarly, a light-emitting region of the first blue light-emitting element (first light-emitting element) BX' (see FIG. 2) is a region in which the transparent conductor 6a, which is the island-shaped first pixel electrode, the blue light-emitting layer (first light-emitting layer), and the transparent conductor 10, which is the common electrode (first common electrode), provided in the first blue light-emitting element (first light-emitting element) BX', overlap each other, and corresponds to the blue pixel BPIX' for BE illustrated in FIG. 1.

On the other hand, as illustrated in FIG. 3, a light-emitting region GPIXHR of the second green light-emitting element (second light-emitting element) GX is a region in which the transparent conductor 6b, which is the island-shaped second pixel electrode, the green light-emitting layer (second light-emitting layer) 8G, and the transparent conductor 10, which is the common electrode (second common electrode), provided in the second green light-emitting element (second light-emitting element) GX, overlap each other, and corresponds to the green pixel GPIX for TE illustrated in FIG. 1.

Note that a second pixel electrode formation region GPIXGER illustrated in FIG. 3 is a formation region of the transparent conductor 6b, which is the island-shaped second pixel electrode, provided in the second green light-emitting element (second light-emitting element) GX.

Although not illustrated in the figure, a light-emitting region of the second red light-emitting element (second light-emitting element) RX (see FIG. 2) is a region in which the transparent conductor 6b, which is the island-shaped second pixel electrode, the red light-emitting layer (second light-emitting layer), and the transparent conductor 10, which is the common electrode (second common electrode), provided in the second red light-emitting element (second light-emitting element) RX, overlap each other, and corresponds to the red pixel RPIX for TE illustrated in FIG. 1. Similarly, a light-emitting region of the second blue light-emitting element (second light-emitting element) BX (see FIG. 2) is a region in which the transparent conductor 6b, which is the island-shaped second pixel electrode, the blue light-emitting layer (second light-emitting layer), and the transparent conductor 10, which is the common electrode (second common electrode), provided in the second blue light-emitting element (second light-emitting element) BX, overlap each other, and corresponds to the blue pixel BPIX for TE illustrated in FIG. 1.

Because of the configuration described above, the display device 1 has both light taken out through the substrate 2 and light taken out from the direction opposite to the direction of the light taken out through the substrate 2. Thus, the display device 1 is a double-sided display device.

A flattened layer formation region HMAR illustrated in FIG. 3 is a region in which the flattened layer 4 is formed, and is a region provided with the second red light-emitting element (second light-emitting element) RX, the second green light-emitting element (second light-emitting element) GX, and the second blue light-emitting element (second light-emitting element) BX. On the other hand, a flattened layer unformed region HMNR illustrated in FIG. 3 is a region in which the flattened layer 4 is not formed, that is, a formation region of the opening 4a in the flattened layer 4, and is provided with the first red light-emitting element (first light-emitting element) RX', the first green light-emitting element (first light-emitting element) GX', and the first blue light-emitting element (first light-emitting element) BX'.

Further, as illustrated in FIGS. 3 and 4, in the flattened layer unformed region HMNR, provided are a wiring line 3 that electrically connects the transparent conductor 6b, which is the island-shaped second pixel electrode, to any one of the second drive circuits RTR, GTR, and BTR, and a wiring line 3' that electrically connects the transparent conductor 6a, which is the island-shaped first pixel electrode, to any one of the first drive circuits RTR', GTR', and BTR'.

In addition, as illustrated in FIGS. 3 and 4, in the flattened layer formation region HMAR, on a side closer to the substrate 2 than the flattened layer 4, a part of the wiring line 3 described above, another wiring line 3", the first drive circuits RTR', GTR', and BTR', and the second drive circuits RTR, GTR, and BTR are provided.

Note that, as illustrated in FIG. 3, the first light blocking member 11 is preferably provided so as to completely overlap at least the first opening 7a in the edge cover 7. In the embodiment, an edge of the first light blocking member 11 overlaps the edge cover 7 except for the first opening 7a. With such a configuration, the first light blocking member 11 is also arranged above an inclined portion forming the first opening 7a in the edge cover 7, thereby preventing light leakage in an upward direction in the bottom emission region. Although not illustrated in the figure, the edge of the first light blocking member 11 may be located outside the flattened layer unformed region HMNR.

In the embodiment, as an example of a case in which the first common electrode provided in each of the first red light-emitting element (first light-emitting element) RX', the first green light-emitting element (first light-emitting element) GX', and the first blue light-emitting element (first light-emitting element) BX', and the second common electrode provided in each of the second red light-emitting element (second light-emitting element) RX, the second green light-emitting element (second light-emitting element) GX, and the second blue light-emitting element (second light-emitting element) BX are made of an optical transparent conductor formed of the same material in the same layer, a case that the optical transparent conductor is the transparent conductor 10 will be described. Examples of materials for the transparent conductor 10 include indium tin oxide (ITO) and indium zinc oxide (IZO). Note that, the first common electrode and the second common electrode do not necessarily need to be oxides as long as they are optical transparent conductors having optical transparency and electrical conductivity. Thus, the first common electrode and the second common electrode may be formed of, for example, Ag nanowires or thin metal layers such as thin Ag films. From the perspective of shortening the manufacturing process and reducing the manufacturing costs, it is preferable that the first common electrode and the second common electrode be formed of the same material in the same layer, that is, formed by, for example, one film formation step using a mask. However, the first common electrode and the second common electrode are not limited to being formed of the same material in the same layer, and may be constituted of different optical transparent conductors from each other. Further, as will be described later, when the first light blocking member 11 is made of a conductor, the first light blocking member 11 itself may be the first common electrode.

In the embodiment, the first common electrode and the second common electrode are made of the transparent conductor 10 and are formed as one layer over at least the entire display region of the display device 1, so that the first common electrode and the second common electrode are electrically connected to each other, and the first common electrode and the second common electrode can be driven by one signal. Note that when the first common electrode and the second common electrode are not electrically connected to each other, the first common electrode and the second common electrode may be driven by one signal, or may be driven by two different signals.

Further, in the embodiment, as an example of a case in which the island-shaped first pixel electrode provided in each of the first red light-emitting element (first light-emitting element) RX', the first green light-emitting element (first light-emitting element) GX', and the first blue light-emitting element (first light-emitting element) BX', and the island-shaped second pixel electrode provided in each of the second red light-emitting element (second light-emitting element) RX, the second green light-emitting element (second light-emitting element) GX, and the second blue light-emitting element (second light-emitting element) BX are made of optical transparent conductors formed of the same material in the same layer, a case that the optical transparent conductors are the transparent conductors 6a and 6b will be described. Examples of materials for the transparent conductors 6a and 6b include indium tin oxide (ITO) and indium zinc oxide (IZO). Note that, the first pixel electrode and the second pixel electrode do not necessarily need to be oxides as long as they are optical transparent conductors having optical transparency and electrical conductivity. Thus, the first pixel electrode and the second pixel electrode may be formed of, for example, Ag nanowires or thin metal layers such as thin Ag films. From the perspective of shortening the manufacturing process and reducing the manufacturing costs, it is preferable that the first pixel electrode and the second pixel electrode be formed of the same material in the same layer, that is, formed by one film formation step and one patterning step. However, the first pixel electrode and the second pixel electrode are not limited to being formed of the same material in the same layer, and may be constituted of different optical transparent conductors from each other. Further, as will be described later, when the second light blocking member 5 is made of a conductor, the second light blocking member 5 itself may be the second pixel electrode.

Note that, in the embodiment, a case in which the first light blocking member 11 provided in each of the first red light-emitting element (first light-emitting element) RX', the first green light-emitting element (first light-emitting element) GX', and the first blue light-emitting element (first light-emitting element) BX' is made by forming a film of a conductor such as a metal with high reflectivity in the visible light region (conductor having visible light reflectivity), followed by patterning will be described as an example. However, the first light blocking member 11 is not limited to being formed of a conductor having visible light reflectivity, and may have low reflectivity or may not be a conductor as long as the first light blocking member 11 is made of a material having low transmittance in the visible light region. In the embodiment, since the first light blocking member 11 is made of a conductor such as a metal having high reflectivity in the visible light region, an electrode formed by layering the first light blocking member 11 and the common electrode (first common electrode), that is, an electrode formed by layering the first light blocking member 11 and the transparent conductor 10, is a first reflective electrode. Note that in the embodiment, a case in which the transparent conductor 10 and the first light blocking member 11 are layered in order from the substrate 2 side is described as an example. However, without being limited thereto, the first light blocking member 11 and the transparent conductor 10 may be layered in order from the substrate 2 side.

Further, in the embodiment, a case in which the second light blocking member 5 provided in each of the second red light-emitting element (second light-emitting element) RX, the second green light-emitting element (second light-emitting element) GX, and the second blue light-emitting element (second light-emitting element) BX is made by forming a film of a conductor such as a metal with high reflectivity in the visible light region (conductor having visible light reflectivity), followed by patterning will be described as an example. However, the second light blocking member 5 is not limited to being formed of a conductor having visible light reflectivity, and may have low reflectivity or may not be a conductor as long as the second light blocking member 5 is made of a material having low transmittance in the visible light region. In the embodiment, since the second light blocking member 5 is made of a conductor such as a metal having high reflectivity in the visible light region, an electrode formed by layering the second light blocking member 5 and the island-shaped second pixel electrode, that is, an electrode formed by layering the second light blocking member 5 and the transparent conductor 6b, is a second reflective electrode. Note that in the embodiment, a case in which the second light blocking member 5 and the transparent conductor 6b are layered in order from the substrate 2 side is described as an example. However, without being limited thereto, the transparent conductor 6b and the second light blocking member 5 may be layered in order from the substrate 2 side.

Note that in the embodiment, a case in which each of the first red light-emitting element (first light-emitting element) RX', the first green light-emitting element (first light-emitting element) GX', the first blue light-emitting element (first light-emitting element) BX', the second red light-emitting element (second light-emitting element) RX, the second green light-emitting element (second light-emitting element) GX, and the second blue light-emitting element (second light-emitting element) BX is a quantum dot light emitting diode (QLED) including a light-emitting layer containing quantum dot (nanoparticle) phosphors will be described as an example. However, without being limited thereto, each of these light-emitting elements may be an organic light emitting diode (OLED) including an organic layer as a light-emitting layer. Further, the first red light-emitting element (first light-emitting element) RX', the first green light-emitting element (first light-emitting element) GX', and the first blue light-emitting element (first light-emitting element) BX' may be QLEDs, and the second red light-emitting element (second light-emitting element) RX, the second green light-emitting element (second light-emitting element) GX, and the second blue light-emitting element (second light-emitting element) BX may be OLEDs. Alternatively, the first red light-emitting element (first light-emitting element) RX', the first green light-emitting element (first light-emitting element) GX', and the first blue light-emitting element (first light-emitting element) BX' may be OLEDs, and the second red light-emitting element (second light-emitting element) RX, the second green light-emitting element (second light-emitting element) GX, and the second blue light-emitting element (second light-emitting element) BX may be QLEDs. Furthermore, some of the first red light-emitting element (first light-emitting element) RX', the first green light-emitting element (first light-emitting element) GX', the first blue light-emitting element (first light-emitting element) BX', the second red light-emitting element (second light-emitting element) RX, the second green light-emitting element (second light-emitting element) GX, and the second blue light-emitting element (second light-emitting element) BX may be QLEDs, and the remaining light-emitting elements may be OLEDs.

Although not illustrated in the figure, each of the first red light-emitting element (first light-emitting element) RX', the first green light-emitting element (first light-emitting element) GX', the first blue light-emitting element (first light-emitting element) BX', the second red light-emitting element (second light-emitting element) RX, the second green light-emitting element (second light-emitting element) GX, and the second blue light-emitting element (second light-emitting element) BX may further include at least one function layer such as an electron transport layer, an electron injection layer, a hole transport layer, and a hole injection layer, in addition to the light-emitting layer described above.

Figure 5:
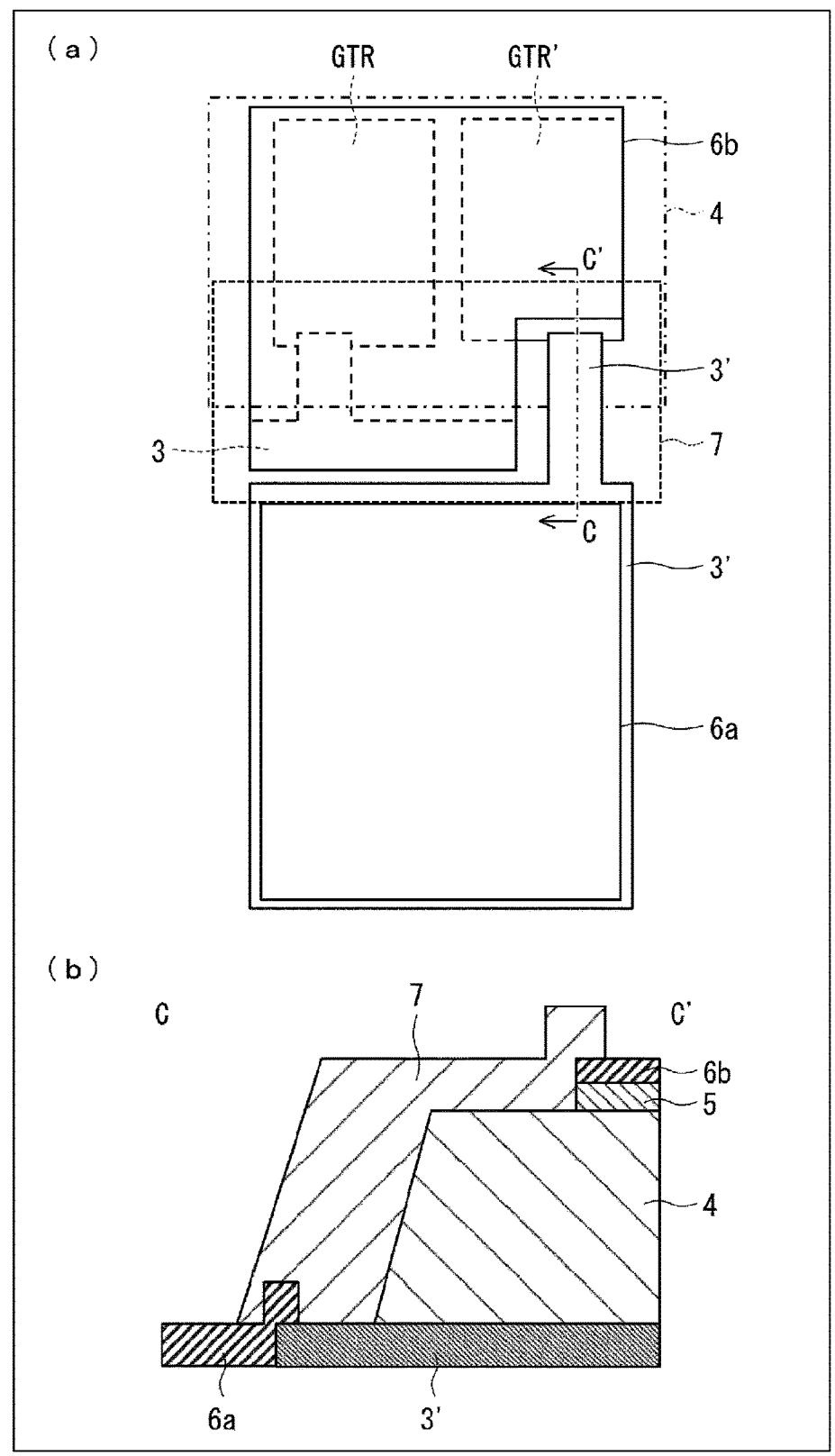
FIG. 5(a) is a plan view illustrating a part of the display region of the display device according to the first embodiment.
FIG. 5(b) is a cross-sectional view taken along a line C-C' of the display device according to the first embodiment illustrated in (a) of FIG. 5.

(a) of FIG. 5 is a plan view illustrating a part of the display region of the display device 1 according to the first embodiment, and (b) of FIG. 5 is a cross-sectional view taken along a line C-C' of the display device 1 according to the first embodiment illustrated in (a) of FIG. 5.

As illustrated in (a) and (b) of FIG. 5, a square-shaped opening is formed in the wiring line 3' that electrically connects the transparent conductor 6a, which is the island-shaped first pixel electrode, provided by the first green light-emitting element (first light-emitting element) GX' that constitutes the green pixel GPIX' for BE, and the first drive circuit GTR'. In other words, an outer periphery of the light-emitting region of the first green light-emitting element (first light-emitting element) GX' that constitutes the green pixel GPIX' for BE is surrounded by the wiring line 3' made of a metal material.

Note that, although not illustrated in the figure, similarly, the square-shaped opening is formed in the wiring line 3' that electrically connects the transparent conductor 6a, which is the island-shaped first pixel electrode, provided by the first red light-emitting element (first light-emitting element) RX' that constitutes the red pixel RPIX' for BE, and the first drive circuit RTR', and in the wiring line 3' that electrically connects the transparent conductor 6a, which is the island-shaped first pixel electrode, provided by the first blue light-emitting element (first light-emitting element) BX' that constitutes the blue pixel BPIX' for BE, and the first drive circuit BTR'. That is, an outer periphery of the light-emitting region of the first red light-emitting element (first light-emitting element) RX' that constitutes the red pixel RPIX' for BE and an outer periphery of the light-emitting region of the first blue light-emitting element (first light-emitting element) BX' that constitutes the blue pixel BPIX' for BE are also surrounded by the wiring lines 3' made of the metal material.

Figure 6:
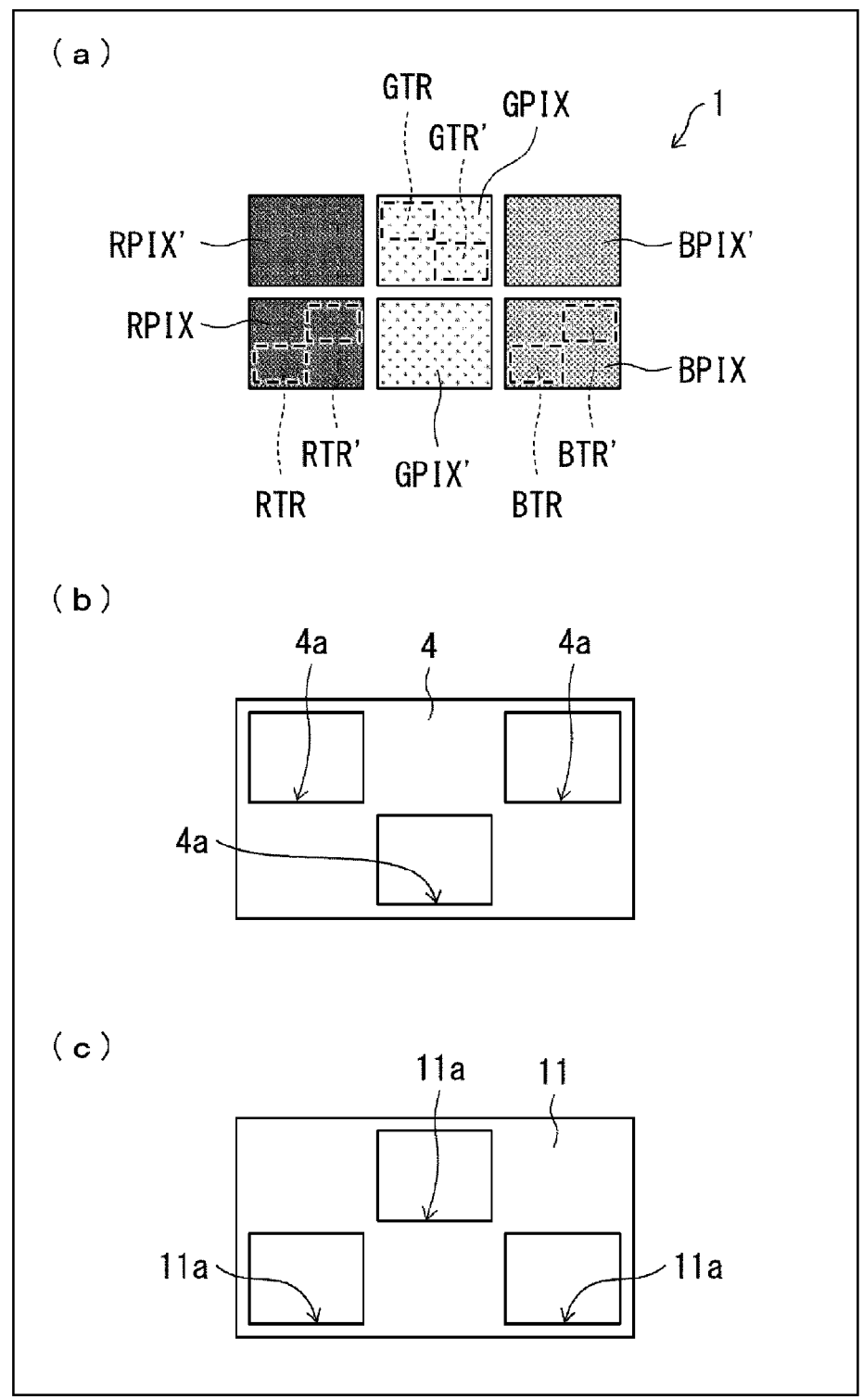
FIG. 6(a) is a diagram illustrating a part of the display region of the display device according to the first embodiment.
FIG. 6(b) is a diagram illustrating a shape of a flattened layer formed in a part of the display region of the display device according to the first embodiment illustrated in (a) of FIG. 6.
FIG. 6(c) is a diagram illustrating a shape of a first light blocking member formed in a part of the display region of the display device according to the first embodiment illustrated in (a) of FIG. 6.

(a) of FIG. 6 is a diagram illustrating a part of the display region of the display device 1 according to the first embodiment, (b) of FIG. 6 is a diagram illustrating a shape of the flattened layer 4 formed in a part of the display region of the display device 1 according to the first embodiment illustrated in (a) of FIG. 6, and (c) of FIG. 6 is a diagram illustrating a shape of the first light blocking member 11 formed in a part of the display region of the display device 1 according to the first embodiment illustrated in (a) of FIG. 6.

As illustrated in (a) of FIG. 6, each of the pixels RPIX', GPIX', BPIX' for BE is surrounded by the pixels RPIX, GPIX, and BPIX for TE, and each of the pixels RPIX, GPIX, and BPIX for TE is surrounded by the pixels RPIX', GPIX', and BPIX' for BE.

Thus, as illustrated in (b) of FIG. 6, the flattened layer 4 has a shape in which the openings 4a are formed at positions corresponding to the pixels RPIX', GPIX', and BPIX' for BE, respectively. Then, in the opening 4a, the transparent conductor 6b, which is the island-shaped second pixel electrode, is electrically connected to any one of the second drive circuits RTR, GTR, and BTR via the wiring line 3 (see FIG. 3).

In the embodiment, in order to form the flattened layer 4 into a shape illustrated in (b) of FIG. 6, a photosensitive resin is applied to the entire surface and then patterned by photolithography. Thus, the flattened layer 4 can be formed as one continuous layer, thereby reducing the possibility of the flattened layer 4 peeling off from the lower layer.

As illustrated in (c) of FIG. 6, the first light blocking member 11 has a shape in which the openings 11a are formed at positions corresponding to the pixels RPIX, GPIX, and BPIX for TE, respectively.

In the embodiment, in order to form the first light blocking member 11 into a shape as illustrated in (c) of FIG. 6, a metal layer having high reflectivity in the visible light region is formed on the entire surface, and then this metal layer is patterned by etching using a resist film having a predetermined shape. Thus, the first light blocking member 11 can be formed as one continuous layer, thereby reducing the resistance of the first reflective electrode when a portion in which the first light blocking member 11 and the transparent conductor 10 are layered is used as the first reflective electrode, or when the first light blocking member 11 itself is used as the first reflective electrode. Further, the possibility of the first light blocking member 11 peeling off from the transparent conductor 10 and the lower layer can be reduced.

Figure 2:
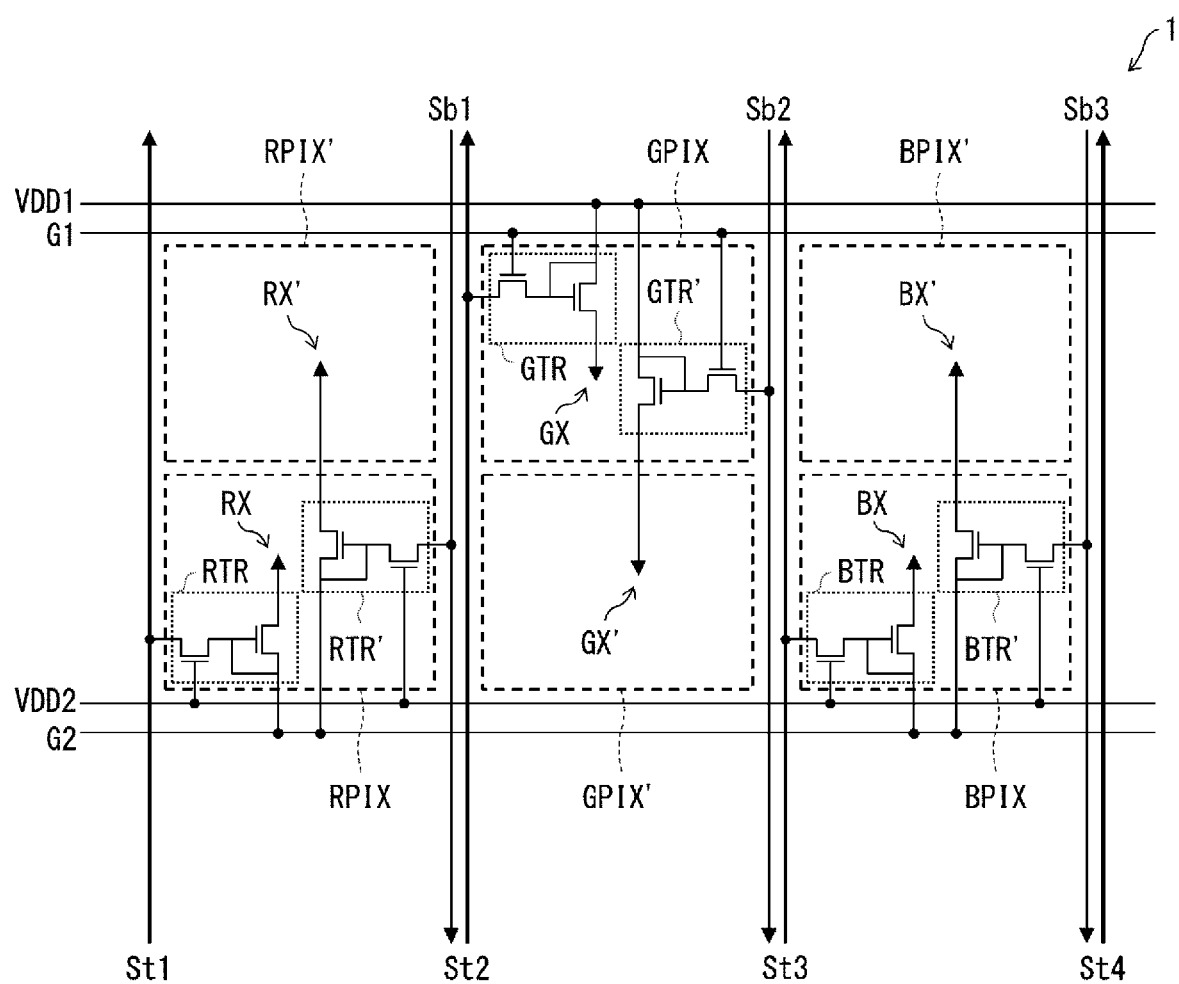
FIG. 2 is a diagram illustrating a configuration example of a circuit of the display device according to the first embodiment.

FIG. 2 is a diagram illustrating a configuration example of a circuit of the display device 1 according to the first embodiment.

As illustrated in FIG. 2, in the display device 1, first source lines Sb1, Sb2, Sb3 . . . for inputting signals (first signals) that control the light emission intensity to the first drive circuits RTR', GTR', and BTR', respectively, extend in an up-down direction in the figure. Further, second source lines St1, St2, St3, St4 . . . for inputting signals (second signals) that control the light emission intensity to the second drive circuits RTR, GTR, and BTR, respectively, extend in the up-down direction in the figure. Note that the extending direction of the first source lines Sb1, Sb2, Sb3 . . . and the extending direction of the second source lines St1, St2, St3, St4 . . . are the second direction in FIG. 1.

As illustrated in FIG. 2, the first red light-emitting element (first light-emitting element) RX' and the second red light-emitting element (second light-emitting element) RX are formed between the first source line Sb1 for inputting a signal for controlling the light emission intensity to the first drive circuit RTR' that controls the light emission intensity of the first red light-emitting element RX' and the second source line St1 for inputting a signal for controlling the light emission intensity to the second drive circuit RTR that controls the light emission intensity of the second red light-emitting element RX, so that the first red light-emitting element (first light-emitting element) RX' and the second red light-emitting element (second light-emitting element) RX are adjacent to each other in the extending direction of the first source lines Sb1, Sb2, Sb3 . . . and the extending direction of the second source lines St1, St2, St3, St4 . . . . Further, the first green light-emitting element (first light-emitting element) GX' and the second green light-emitting element (second light-emitting element) GX are formed between the first source line Sb2 for inputting a signal for controlling the light emission intensity to the first drive circuit GTR' that controls the light emission intensity of the first green light-emitting element GX' and the second source line St2 for inputting a signal for controlling the light emission intensity to the second drive circuit GTR that controls the light emission intensity of the second green light-emitting element GX, so that the first green light-emitting element (first light-emitting element) GX' and the second green light-emitting element (second light-emitting element) GX are adjacent to each other in the extending direction of the first source lines Sb1, Sb2, Sb3 . . . and the extending direction of the second source lines St1, St2, St3, St4 . . . . Furthermore, the first blue light-emitting element (first light-emitting element) BX' and the second blue light-emitting element (second light-emitting element) BX are formed between the first source line Sb3 for inputting a signal for controlling the light emission intensity to the first drive circuit BTR' that controls the light emission intensity of the first blue light-emitting element BX' and the second source line St3 for inputting a signal for controlling the light emission intensity to the second drive circuit BTR that controls the light emission intensity of the second blue light-emitting element BX, so that the first blue light-emitting element (first light-emitting element) BX' and the second blue light-emitting element (second light-emitting element) BX are adjacent to each other in the extending direction of the first source lines Sb1, Sb2, Sb3 . . . and the extending direction of the second source lines St1, St2, St3, St4 . . . .

Note that the first source lines Sb1, Sb2, Sb3 . . . , and the second source lines St1, St2, St3, St4 . . . , are arranged so that the first source line Sb1 and the second source line St2, the first source line Sb2 and the second source line St3, the first source line Sb3 and the second source line St4, and the first source line Sbn-1 and the second source line Stn (n is a natural number of 5 or greater) are adjacent to each other.

Further, as illustrated in FIG. 2, in the display device 1, power supply voltage lines VDD1, VDD2 . . . and gate signal lines G1, G2 . . . further extend in a right-left direction in the figure. Note that the extending direction of the power supply voltage lines VDD1, VDD2 . . . and the extending direction of the gate signal lines G1, G2 . . . are the first direction in FIG. 1.

Each of the first drive circuit RTR' that controls the light emission intensity of the first red light-emitting element RX', and the second drive circuit RTR that controls the light emission intensity of the second red light-emitting element RX, is supplied with a power supply voltage via one power supply voltage line VDD2, and a gate signal via one gate signal line G2.

Further, each of the first drive circuit GTR' that controls the light emission intensity of the first green light-emitting element GX', and the second drive circuit GTR that controls the light emission intensity of the second green light-emitting element GX, is supplied with a power supply voltage via one power supply voltage line VDD1, and a gate signal via one gate signal line G1.

Furthermore, each of the first drive circuit BTR' that controls the light emission intensity of the first blue light-emitting element BX', and the second drive circuit BTR that controls the light emission intensity of the second blue light-emitting element BX, is supplied with a power supply voltage via one power supply voltage line VDD2, and a gate signal via one gate signal line G2.

Note that the power supply voltage lines VDD1, VDD2 . . . and the gate signal lines G1, G2 . . . are alternately provided, and the power supply voltage line VDD1 and the gate signal line G1, and the power supply voltage line VDD2 and the gate signal line G2 are arranged so as to be adjacent to each other.

Because of the above configuration, in the display device 1, the first drive circuits RTR', GTR', and BTR' and the second drive circuits RTR, GTR, and BTR can be driven independently of each other, thereby achieving a double-sided display device that can display different images on both the front side and back side display surfaces.

Note that, as illustrated in FIG. 2, the first red light-emitting element (first light-emitting element) RX' and the second red light-emitting element (second light-emitting element) RX are provided in a region surrounded by the power supply voltage line VDD1 and the gate signal line G1, the power supply voltage line VDD2 and the gate signal line G2, the first source line Sb1, and the second source line St1. Further, the first green light-emitting element (first light-emitting element) GX' and the second green light-emitting element (second light-emitting element) GX are provided in a region surrounded by the power supply voltage line VDD1 and the gate signal line G1, the power supply voltage line VDD2 and the gate signal line G2, the first source line Sb2, and the second source line St2. Furthermore, the first blue light-emitting element (first light-emitting element) BX' and the second blue light-emitting element (second light-emitting element) BX are provided in a region surrounded by the power supply voltage line VDD1 and the gate signal line G1, the power supply voltage line VDD2 and the gate signal line G2, the first source line Sb3, and the second source line St3.

In the embodiment, as illustrated in FIG. 2, in the first drive circuits RTR', GTR', and BTR', a case in which the first drive circuit GTR' is connected to a gate signal line different from a gate signal line to which the first drive circuits RTR' and BTR' are connected, will be described as an example. However, without being limited thereto, one of the first drive circuits RTR', GTR', and BTR' may be connected to a gate signal line different from a gate signal line to which the remaining first drive circuits are connected.

Further, in the embodiment, as illustrated in FIG. 2, in the second drive circuits RTR, GTR, and BTR, a case in which the second drive circuit GTR is connected to a gate signal line different from a gate signal line to which the second drive circuits RTR and BTR are connected, will be described as an example. However, without being limited thereto, one of the second drive circuits RTR, GTR, and BTR may be connected to a gate signal line different from a gate signal line to which the remaining second drive circuits are connected.

Note that in the embodiment, the first drive circuit GTR' and the second drive circuit GTR are connected to the gate signal line G1, and the first drive circuit RTR', the second drive circuit RTR, the first drive circuit BTR', and the second drive circuit BTR are connected to the gate signal line G2. Thus, the write timing to the first drive circuit GTR' and the second drive circuit GTR is different from the write timing to the first drive circuit RTR', the second drive circuit RTR, the first drive circuit BTR', and the second drive circuit BTR.

Note that in the embodiment, a case in which only a source driver (not illustrated) that inputs signals (first signals) to control the light emission intensity of the first light-emitting elements RX', GX', and BX', to the first source lines Sb1, Sb2, Sb3 . . . , is provided on the upper side of FIG. 2, and only a source driver (not illustrated) that inputs signals (second signals) to control the light emission intensity of the second light-emitting elements RX, GX, and BX, to the second source lines St1, St2, St3, St4 . . . , is provided on the lower side of FIG. 2 will be described as an example. However, without being limited thereto, only one source driver may be provided on either the upper side of FIG. 2 or the lower side of FIG. 2.

Further, in the embodiment, a case in which only one gate driver (not illustrated) that inputs a gate signal to each of the gate signal lines G1, G2 is provided will be described as an example. However, without being limited thereto, for example, a gate driver that inputs gate signals to odd-numbered gate signal lines may be provided on the left side of FIG. 2, and a gate driver that inputs gate signals to even-numbered gate signal lines may be provided on the right side of FIG. 2.

Figure 7:
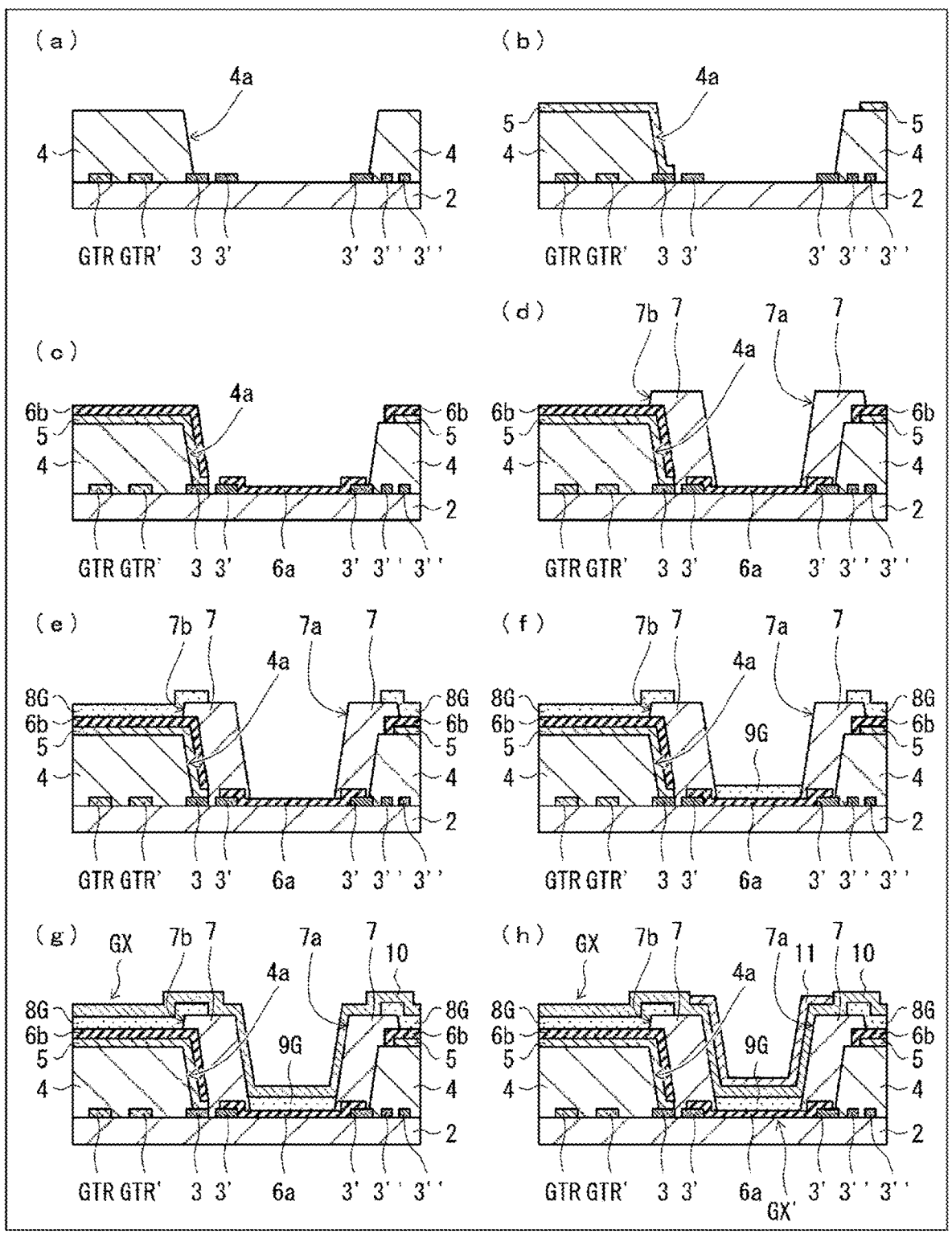
FIGS. 7(a) to 7(h) are diagrams illustrating an example of a manufacturing method of the display device according to the first embodiment.

(a) to (h) of FIG. 7 are diagrams illustrating an example of a manufacturing method of the display device 1 according to the first embodiment.

As illustrated in (a) of FIG. 7, first, on the substrate 2, the wiring lines 3, 3', and 3", the first drive circuits RTR', GTR', and BTR' including active elements (e.g., TFT elements), respectively, and the second drive circuits RTR, GTR, and BTR including active elements (e.g., TFT elements), respectively, are formed (first step). Thereafter, the flattened layer 4, which is a photosensitive resin, is formed on the entire surface of the substrate 2, followed by an exposure step using a mask and a development step, to form the flattened layer 4 having the opening 4a (second step).

Subsequently, as illustrated in (b) of FIG. 7, the second light blocking member 5 made of a metal having high reflectivity in the visible light region is formed as a film on the entire surface, and then patterned by etching using a resist film having a predetermined shape (third step). Note that the second light blocking member 5 is in contact with the wiring line 3 electrically connected to any one of the second drive circuits RTR, GTR, and BTR in the opening 4a in the flattened layer 4.

Subsequently, as illustrated in (c) of FIG. 7, the transparent conductor 6a, which serves as the island-shaped first pixel electrode, the transparent conductor 6b, which serves as the island-shaped second pixel electrode, are formed simultaneously using a transparent conductor. That is, the transparent conductor is formed into a film on the entire surface and then patterned by etching using a resist film having a predetermined shape (fourth step).

Note that the island-shaped first pixel electrode made of the transparent conductor 6a is in contact with the wiring line 3' electrically connected to any one of the first drive circuits RTR', GTR', and BTR' in the opening 4a in the flattened layer 4. Further, the island-shaped second pixel electrode made of the transparent conductor 6b is in contact with the wiring line 3 electrically connected to any one of the second drive circuits RTR, GTR, and BTR via the second light blocking member 5 in the opening 4a in the flattened layer 4. Note that a portion in which the second light blocking member 5 and the transparent conductor 6b are layered is the second reflective electrode, and by adopting such a layered structure, the resistance of the second reflective electrode can be reduced.

Subsequently, as illustrated in (d) of FIG. 7, the edge cover 7 having the first opening 7a and the second opening 7b is formed so as to overlap the edge portion of the transparent conductor 6a, which is the island-shaped first pixel electrode, and the edge portion of the transparent conductor 6b, which is the island-shaped second pixel electrode (fifth step). In other words, the edge cover 7, which is a photosensitive resin, is formed on the entire surface of the substrate 2, followed by an exposure step using a mask and a development step, to form the edge cover 7 having the first opening 7a and the second opening 7b. On the other hand, when the edge cover 7 is formed using a material that is not photosensitive, the edge cover 7 may be formed as a film on the entire surface of the substrate 2 and then patterned by etching using a resist film having a predetermined shape. Note that the edge of the first opening 7a in the edge cover 7 is located inside the edge of the opening 4a in the flattened layer 4.

Subsequently, as illustrated in (e) of FIG. 7, the second light-emitting layers included in the second light-emitting elements RX, GX, and BX, respectively, are formed (sixth step). Note that (e) of FIG. 7 illustrates only the green light-emitting layer (second light-emitting layer) 8G included in the second green light-emitting element (second light-emitting element) GX. However, this step also includes steps of forming a red light-emitting layer (second light-emitting layer) 8R included in the second red light-emitting element (second light-emitting element) RX and a blue light-emitting layer (second light-emitting layer) 8B included in the second blue light-emitting element (second light-emitting element) BX, which are not illustrated.

A method of forming these light-emitting layers into predetermined shapes is not limited. These light-emitting layers, for example, may be formed into predetermined shapes by coating and photolithography, may be formed into predetermined shapes by vapor deposition using masks, or may be formed into predetermined shapes by an ink-jet method using the edge cover 7.

Subsequently, as illustrated in (f) of FIG. 7, the first light-emitting layers included in the first light-emitting elements RX', GX', and BX', respectively, are formed (seventh step). Note that (f) of FIG. 7 illustrates only the green light-emitting layer (first light-emitting layer) 9G included in the first green light-emitting element (first light-emitting element) GX'. However, this step also includes steps of forming a red light-emitting layer (first light-emitting layer) 9R included in the first red light-emitting element (first light-emitting element) RX', and a blue light-emitting layer (first light-emitting layer) 9B included in the first blue light-emitting element (first light-emitting element) BX', which are not illustrated.

A method of forming these light-emitting layers into predetermined shapes is not limited. These light-emitting layers, for example, may be formed into predetermined shapes by coating and photolithography, may be formed into predetermined shapes by vapor deposition using masks, or may be formed into predetermined shapes by an ink-jet method using the edge cover 7.

In the embodiment, the second light-emitting layers included in the second light-emitting elements RX, GX, and BX, respectively, are formed into predetermined shapes by coating and photolithography or vapor deposition using masks, and the first light-emitting layers included in the first light-emitting elements RX', GX', and BX', respectively, are formed in predetermined shapes by an ink-jet method using the edge cover 7. Thus, the step of forming the second light-emitting layers included in the second light-emitting elements RX, GX, and BX, respectively, and the step of forming the first light-emitting layers included in the first light-emitting elements RX', GX', and BX', respectively, need to be separate steps even when they are steps of forming the light-emitting layers having the same color, but the methods of forming these light-emitting layers are not limited thereto. For example, when the second light-emitting layers included in the second light-emitting elements RX, GX, and BX, respectively, and the first light-emitting layers included in the first light-emitting elements RX', GX', and BX', respectively, are formed by the same method of either coating and photolithography, vapor deposition using masks, or an ink-jet method using the edge cover 7, the steps of forming the light-emitting layers having the same color can be performed in one step.

Subsequently, as illustrated in (g) of FIG. 7, the common electrodes (first common electrode and second common electrode) are formed of the transparent conductor 10 (eighth step). That is, the transparent conductor 10 is formed on the entire surface as a film, and then patterned so that the transparent conductor 10 remains at least on the entire surface of the display region by etching using a resist film having a predetermined shape. Here, a case is described in which the first common electrode and the second common electrode are made of the same material and formed simultaneously in one step. But without being limited thereto, the first common electrode and the second common electrode may be made of different materials and formed in two different steps.

Subsequently, as illustrated in (h) of FIG. 7, the first light blocking member 11 made of a metal having high reflectivity in the visible light region is formed as a film on the entire surface, and then patterned by etching using a resist film having a predetermined shape (ninth step). Note that a portion in which the first light blocking member 11 and the transparent conductor 10 are layered is the first reflective electrode, and by adopting such a layered structure, the resistance of the first reflective electrode can be reduced.

Figure 8:
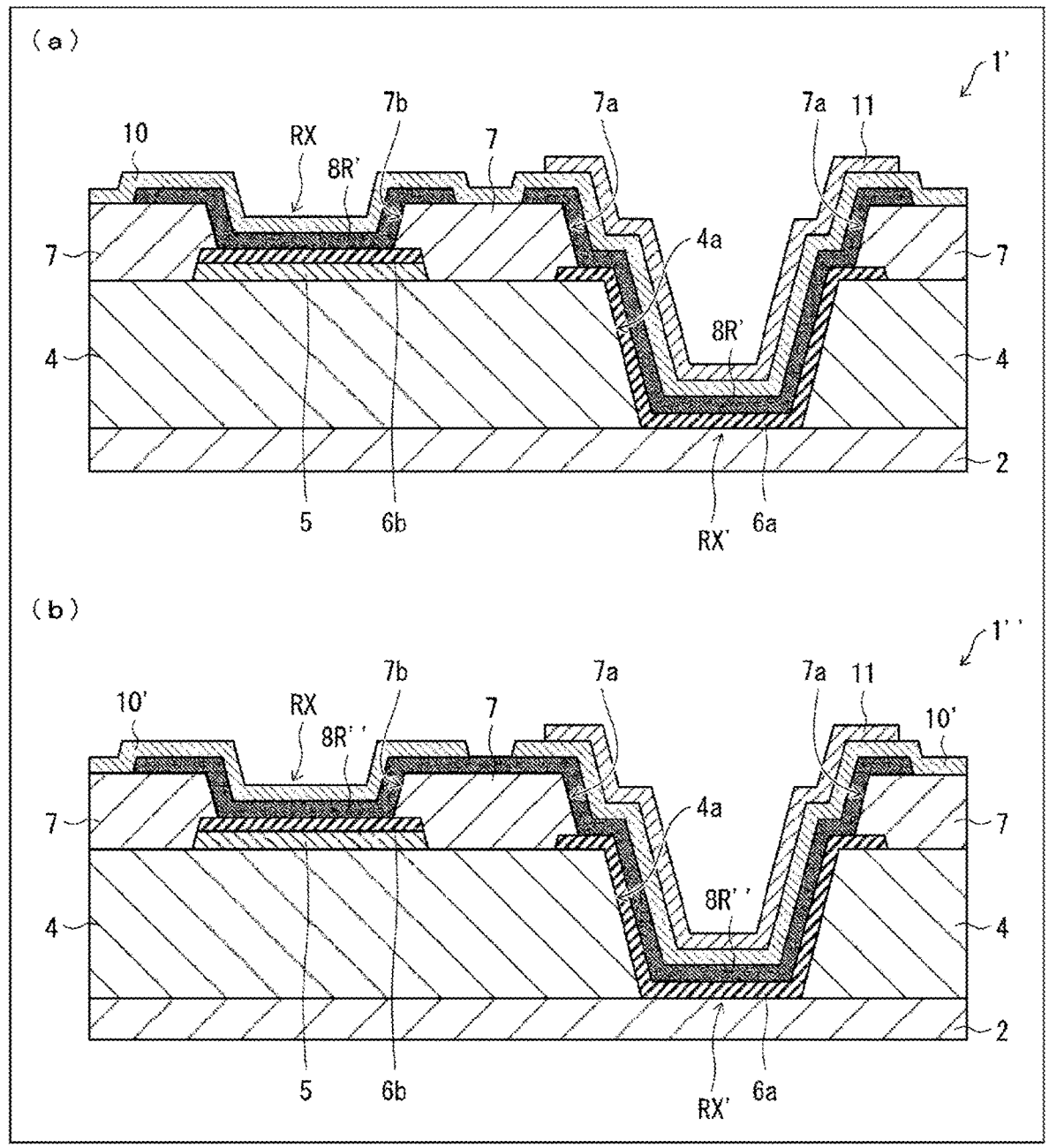
FIG. 8(a) is a diagram illustrating a schematic configuration of a display device according to a modified example of the first embodiment.
FIG. 8(b) is a diagram illustrating a schematic configuration of a display device according to another modified example of the first embodiment.

(a) of FIG. 8 is a diagram illustrating a schematic configuration of a display device 1' according to a modified example of the first embodiment, and (b) of FIG. 8 is a diagram illustrating a display device 1" according to another modified example of the first embodiment.

In the display device 1' illustrated in (a) of FIG. 8, the edge of the first opening 7a in the edge cover 7 is located outside the edge of the opening 4a in the flattened layer 4. In the display device 1 illustrated in FIG. 3, the edge of the first opening 7a in the edge cover 7 is located inside the edge of the opening 4a in the flattened layer 4. In this respect, the display device 1' is different from the display device 1.

Further, a step of forming the light-emitting layer in the display device 1' illustrated in (a) of FIG. 8 is different from the step of forming the light-emitting layer in the display device 1 described above in that the second light-emitting layers included in the second light-emitting elements RX, GX, and BX, and the first light-emitting layers included in the first light-emitting element RX', GX', and BX' are formed by the same method of any of coating and photolithography, vapor deposition using masks, and an ink-jet method using the edge cover 7, for example, a red light-emitting layer (second light-emitting layer) 8R' included in the second red light-emitting element RX and a red light-emitting layer (first light-emitting layer) 8R' included in the first red light-emitting element RX' are formed in the same step. Note that in the display device 1' illustrated in (a) of FIG. 8, each of the red light-emitting layer (second light-emitting layer) 8R' included in the second red light-emitting element RX and the red light-emitting layer (first light-emitting layer) 8R' included in the first red light-emitting element RX' is formed in an island shape.

On the other hand, in a display device 1" illustrated in (b) of FIG. 8, a red light-emitting layer (second light-emitting layer) 8R" included in the second red light-emitting element RX and a red light-emitting layer (first light-emitting layer) 8R" included in the first red light-emitting element RX' are formed as one continuous light-emitting layer. In the display device 1' illustrated in (a) of FIG. 8, each of the red light-emitting layer (second light-emitting layer) 8R' included in the second red light-emitting element RX and the red light-emitting layer (first light-emitting layer) 8R' included in the first red light-emitting element RX' is formed in an island shape. In this respect, the display device 1" is different from the display device 1'.

Further, in the display device 1" illustrated in (b) of FIG. 8, a transparent conductor 10' is divided into the first common electrode and the second common electrode and are formed in island shapes, that is, the first common electrode and the second common electrode are electrically separate from each other. In the display device 1 illustrated in FIG. 3 and the display device 1' illustrated in (a) of FIG. 8, the first common electrode and the second common electrode are formed of one continuous film as one common electrode. In this respect, the display device 1" is different from the display device 1 and the display device 1'.

Figure 9:
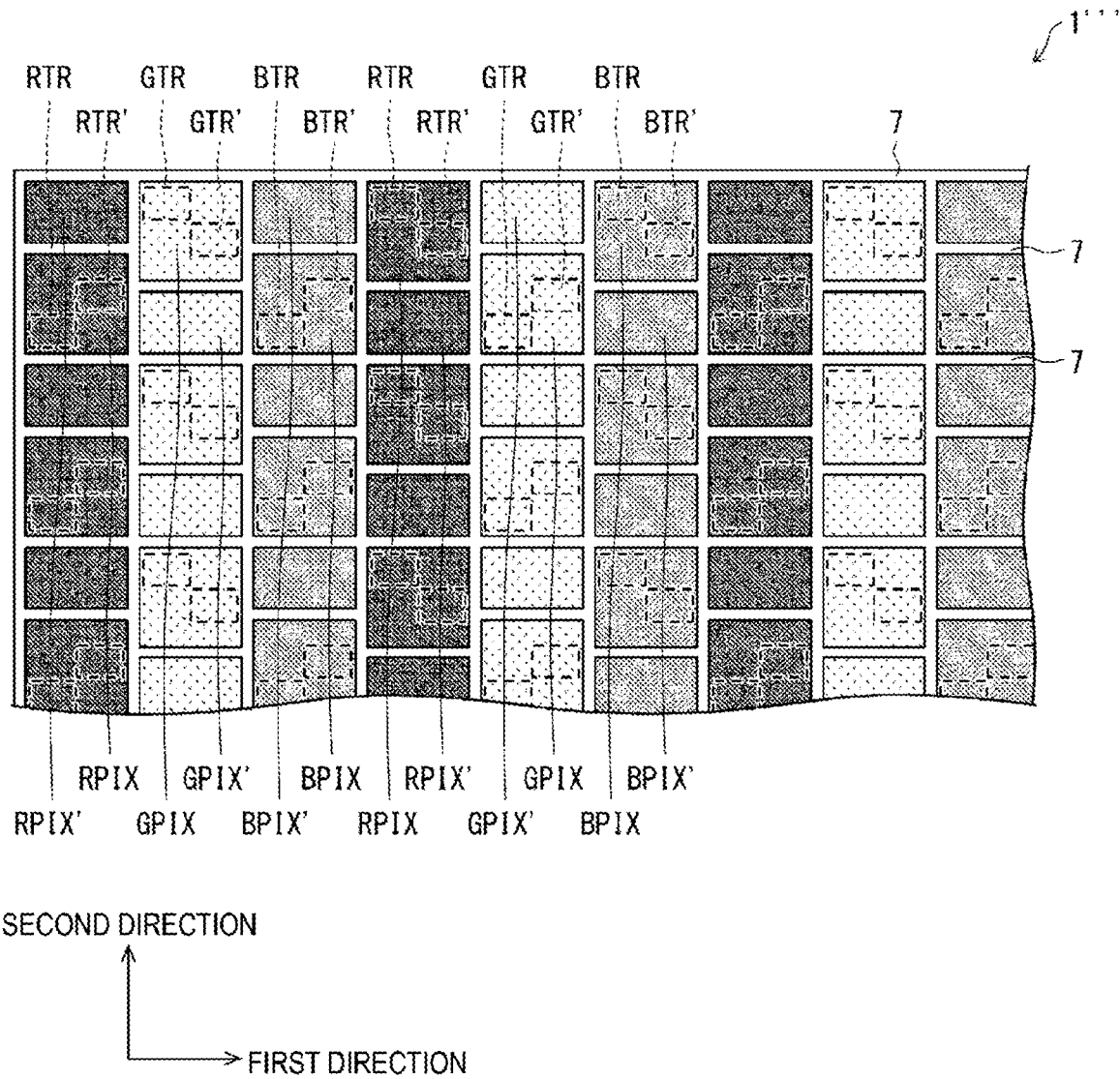
FIG. 9 is a plan view illustrating a display region of a display device according to still another modified example of the first embodiment.

FIG. 9 is a plan view illustrating a display region of a display device 1''' according to still another modified example of the first embodiment.

Figure 10:
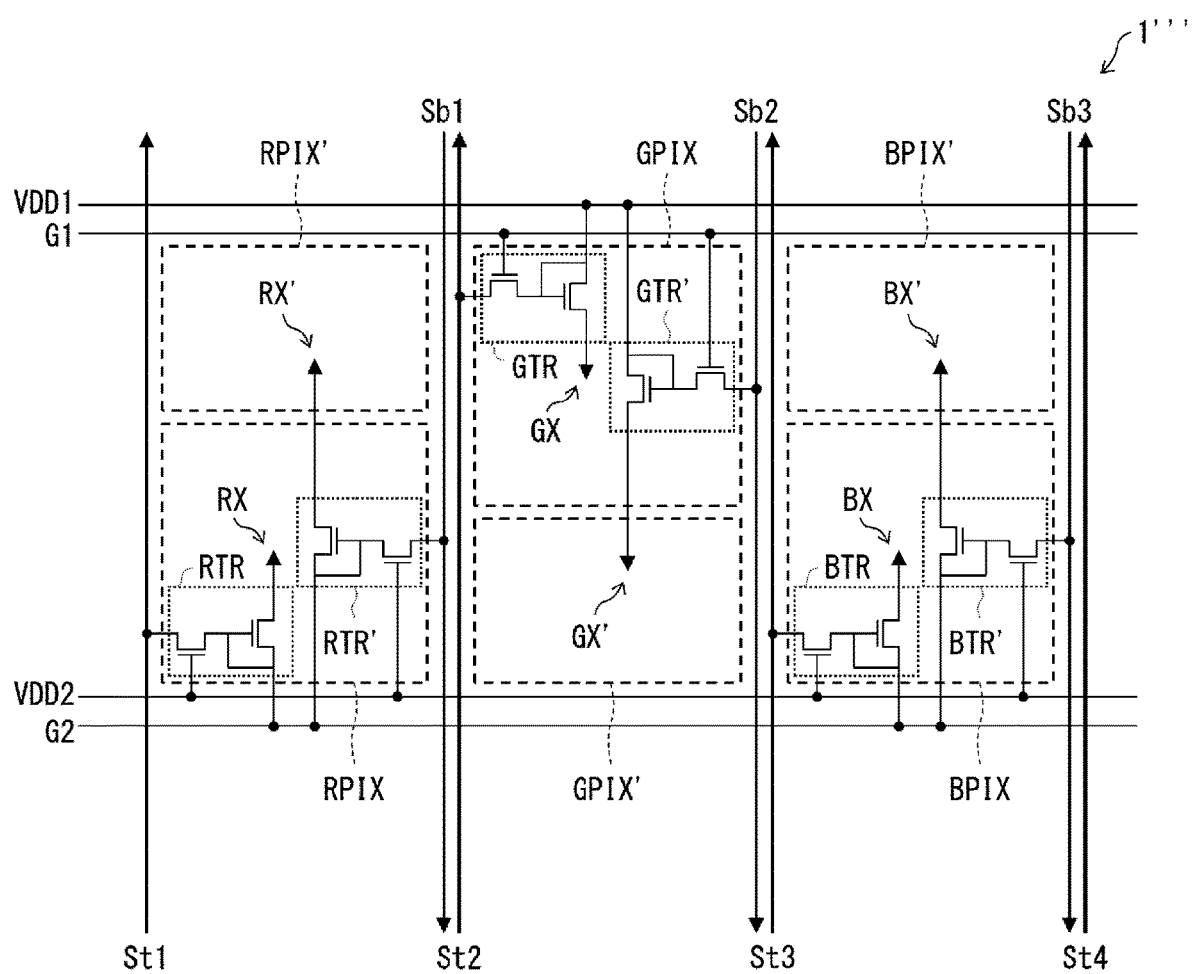
FIG. 10 is a diagram illustrating a configuration example of a circuit of the display device illustrated in FIG. 9.

FIG. 10 is a diagram illustrating a configuration example of a circuit of the display device 1''' illustrated in FIG. 9.

As illustrated in FIGS. 9 and 10, in a display region of the display device 1''', the first light-emitting region including the red pixel RPIX' for BE and the red pixel RPIX for TE adjacent to each other in the second direction in the figure, the second light-emitting region including the green pixel GPIX' for BE and the green pixel GPIX for TE adjacent to each other in the second direction, and the third light-emitting region including the blue pixel BPIX' for BE and the blue pixel BPIX for TE adjacent to each other in the second direction, are arranged adjacent to each other in the first direction in the figure.

The display device 1''' illustrated in FIG. 9 is different from the display device 1 illustrated in FIG. 1 in that in the display region, a size of the red pixel RPIX' for BE is smaller than a size of the red pixel RPIX for TE in the first light-emitting region, a size of the green pixel GPIX' for BE is smaller than a size of the green pixel GPIX for TE in the second light-emitting region, and a size of the blue pixel BPIX' for BE is smaller than a size of the blue pixel BPIX for TE in the third light-emitting region.

In the display region of the display device 1 illustrated in FIG. 1 described above, a size of the red pixel RPIX' for BE and a size of the red pixel RPIX for TE in the first light-emitting region are the same, a size of the green pixel GPIX' for BE and a size of the green pixel GPIX for TE in the second light-emitting region are the same, and a size of the blue pixel BPIX' for BE and a size of the blue pixel BPIX for TE in the third light-emitting region are the same.

For the display device 1''' described above, a case in which the sizes of the pixels RPIX', GPIX', and BPIX' for BE are the same, the sizes of the pixels RPIX, GPIX, and BPIX for TE are also the same, and the size of the pixels RPIX', GPIX', and BPIX' for BE is smaller than the size of the RPIX, GPIX, and BPIX for TE, will be described as an example. However, the sizes of these pixels are not limited thereto. For example, the sizes of the pixels RPIX', GPIX', and BPIX' for BE may be different from each other, and the sizes of the pixels RPIX, GPIX, and BPIX for TE may also be different from each other. The size of the pixels RPIX', GPIX', and BPIX' for BE may be greater than the size of the RPIX, GPIX, and BPIX for TE.

As illustrated in FIG. 10, also for the display device 1''' in which the sizes of the pixels RPIX', GPIX', and BPIX' for BE are the same, the sizes of the pixels RPIX, GPIX, and BPIX for TE are also the same, and the size of the pixels RPIX', GPIX', and BPIX' for BE is smaller than the size of the RPIX, GPIX, and BPIX for TE, the first red light-emitting element (first light-emitting element) RX' and the second red light-emitting element (second light-emitting element) RX are provided in a region surrounded by the power supply voltage line VDD1 and the gate signal line G1, the power supply voltage line VDD2 and the gate signal line G2, the first source line Sb1, and the second source line St1. Further, the first green light-emitting element (first light-emitting element) GX' and the second green light-emitting element (second light-emitting element) GX are provided in a region surrounded by the power supply voltage line VDD1 and the gate signal line G1, the power supply voltage line VDD2 and the gate signal line G2, the first source line Sb2, and the second source line St2. Furthermore, the first blue light-emitting element (first light-emitting element) BX' and the second blue light-emitting element (second light-emitting element) BX are provided in a region surrounded by the power supply voltage line VDD1 and the gate signal line G1, the power supply voltage line VDD2 and the gate signal line G2, the first source line Sb3, and the second source line St3.

Second Embodiment

Next, a second embodiment according to the disclosure will be described with reference to FIGS. 11 and 12. The second embodiment is different from the first embodiment in that, in a display region of a display device 20, in the first direction (illustrated in (a) of FIG. 11), which is the extending direction of the power supply voltage lines VDD1, VDD2 . . . and the extending direction of the gate signal lines G1, G2 . . . , the first light-emitting elements RX', GX', and BX' are adjacent to the first light-emitting elements RX', GX', and BX' having different color light-emitting layers, and the second light-emitting elements RX, GX, and BX are adjacent to the second light-emitting elements RX, GX, and BX having different color light-emitting layers. The other details of the second embodiment are as described in the first embodiment. For convenience of explanation, components having the same functions as those described in diagrams of the first embodiment are appended with the same reference signs, and descriptions thereof may be omitted.

Figure 11:
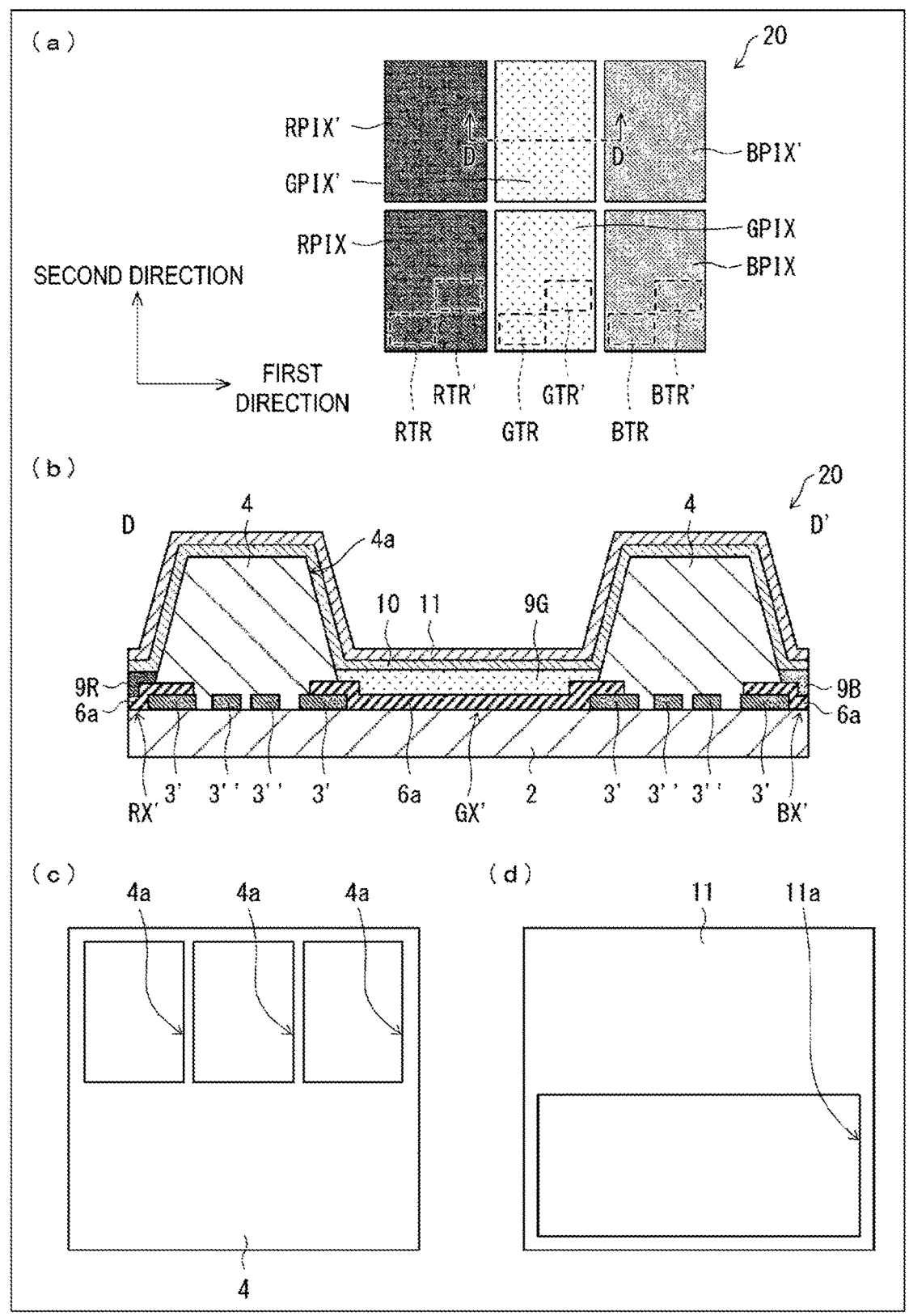
FIG. 11(a) is a diagram illustrating a part of a display region of a display device according to a second embodiment.
FIG. 11(b) is a cross-sectional view taken along a line D-D' of the display device according to the second embodiment illustrated in (a) of FIG. 11.
FIG. 11(c) is a diagram illustrating a shape of a flattened layer formed in a part of the display region of the display device according to the second embodiment illustrated in (a) of FIG. 11.
FIG. 11(d) is a diagram illustrating a shape of a first light blocking member formed in a part of the display region of the display device according to the second embodiment illustrated in (a) of FIG. 11.

(a) of FIG. 11 is a diagram illustrating a part of the display region of the display device 20 according to the second embodiment, (b) of FIG. 11 is a cross-sectional view taken along a line D-D' of the display device 20 illustrated in (a) of FIG. 11, (c) of FIG. 11 is a diagram illustrating a shape of the flattened layer 4 formed in a part of the display region of the display device 20 illustrated in (a) of FIG. 11, and (d) of FIG. 11 is a diagram illustrating a shape of the first light blocking member 11 formed in a part of the display region of the display device 20 illustrated in (a) of FIG. 11.

As illustrated in (a) of FIG. 11, in the display region of the display device 20, in the first direction, which is the extending direction of the power supply voltage lines VDD1, VDD2 . . . (illustrated in FIG. 12) and the extending direction of the gate signal lines G1, G2 . . . (illustrated in FIG. 12), the first light-emitting elements RX', GX', and BX' are adjacent to the first light-emitting elements RX', GX', and BX' having different color light-emitting layers, and the second light-emitting elements RX, GX, and BX are adjacent to the second light-emitting elements RX, GX, and BX having different color light-emitting layers.

As illustrated in (a) of FIG. 11, in the display region of the display device 20, the first light-emitting region including the red pixel RPIX' for BE and the red pixel RPIX for TE adjacent to each other in the second direction, which is an up-down direction in the figure, the second light-emitting region including the green pixel GPIX' for BE and the green pixel GPIX for TE adjacent to each other in the second direction, and the third light-emitting region including the blue pixel BPIX' for BE and the blue pixel BPIX for TE adjacent to each other in the second direction, are arranged adjacent to each other in the first direction, which is a right-left direction in the figure.

Then, the red pixel RPIX' for BE, the green pixel GPIX' for BE, and the blue pixel BPIX' for BE, in the first light-emitting region, the second light-emitting region, and the third light-emitting region, which are arranged adjacent to each other in the first direction, are one display unit for bottom emission.

In addition, the red pixel RPIX for TE, the green pixel GPIX for TE, and the blue pixel BPIX for TE, in the first light-emitting region, the second light-emitting region, and the third light-emitting region, which are arranged adjacent to each other in the first direction, are one display unit for top emission.

As illustrated in (b), (c), and (d) of FIG. 11, in a region in which the first red light-emitting element (first light-emitting element) RX' constituting the red pixel RPIX' for BE, the first green light-emitting element (first light-emitting element) GX' constituting the green pixel GPIX' for BE, and the first blue light-emitting element (first light-emitting element) BX' constituting the blue pixel BPIX' for BE, are arranged to be adjacent to each other in the first direction, which is a right-left direction in the figure, the openings 4a in the flattened layer 4 are independently formed corresponding to the first light-emitting elements RX', GX', and BX' constituting the pixels RPIX', GPIX', and BPIX' for BE, respectively.

Further, in the region in which the first light-emitting elements RX', GX', and BX' constituting the pixels RPIX', GPIX', and BPIX' for BE, respectively, are arranged so as to be adjacent to each other in the first direction, which is the right-left direction in the figure, the first light blocking member 11 is formed in a stripe shape along the first direction so as to cover the first light-emitting elements RX', GX', and BX' constituting the pixels RPIX', GPIX', and BPIX' for BE, respectively. On the other hand, in a region in which the second light-emitting elements RX, GX, and BX constituting the pixels RPIX, GPIX, and BPIX for TE, respectively, are arranged so as to be adjacent to each other in the first direction, which is the right-left direction in the figure, the opening 11a in the first light blocking member 11 is formed in a stripe shape along the first direction.

As illustrated in (d) of FIG. 11, the first light blocking member 11 included in the display device 20 is formed in a stripe shape along the first direction, which is the right-left direction in the figure, so that the resistance can be reduced and the pattern can be formed more easily compared to the first light blocking member 11 provided in the display device 1 according to the first embodiment, which has the shape illustrated in (c) of FIG. 6.

Figure 12:
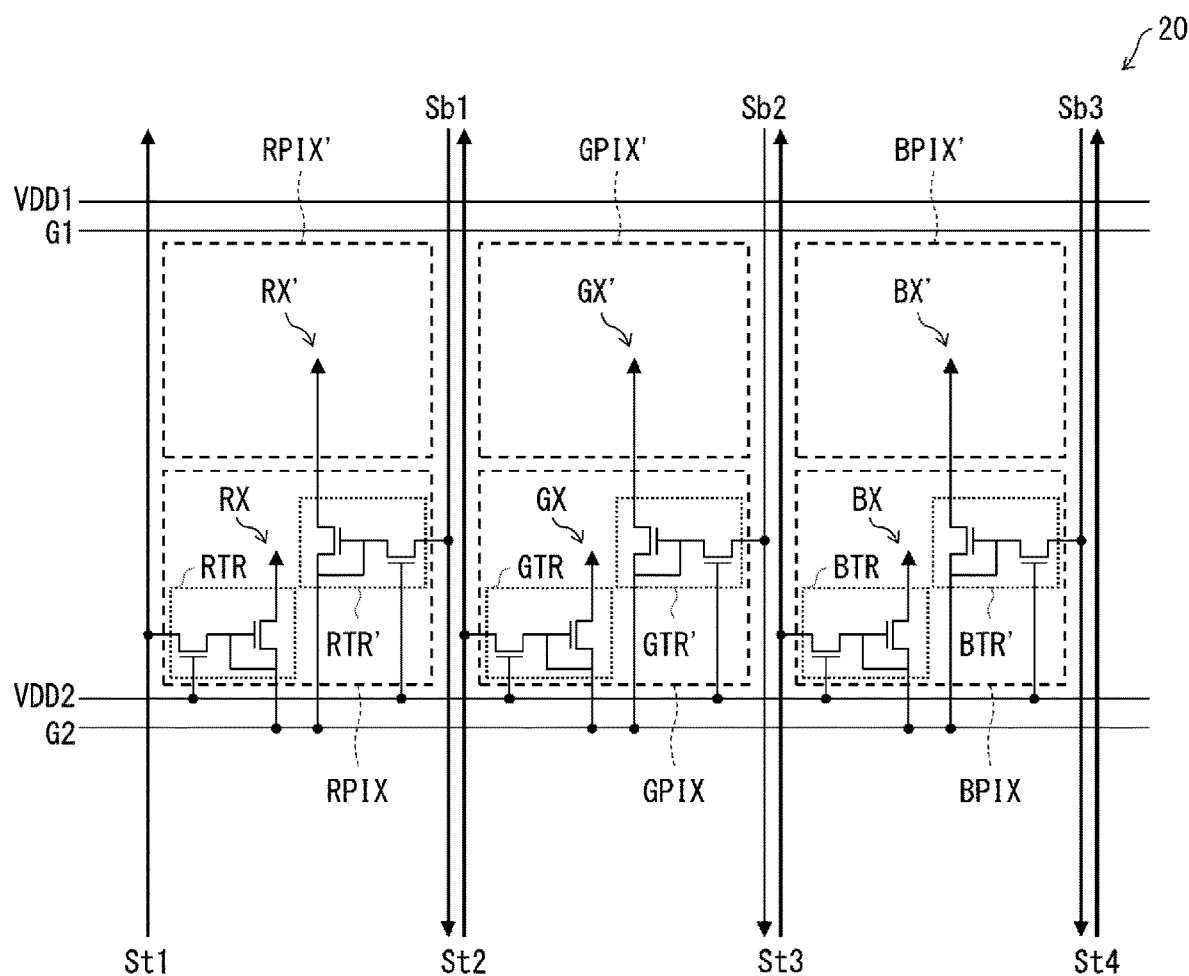
FIG. 12 is a diagram illustrating a configuration example of a circuit of the display device according to the second embodiment.

FIG. 12 is a diagram illustrating a configuration example of a circuit of the display device 20 according to the second embodiment.

As illustrated in FIG. 12, the power supply voltage lines VDD1, VDD2 . . . , and the gate signal lines G1, G2 . . . extend in the right-left direction in the figure, and this extending direction is the first direction.

The first drive circuits RTR', GTR', and BTR', which are located adjacent to each other in the first direction, and the second drive circuits RTR, GTR, and BTR, which are located adjacent to each other in the first direction, are each supplied with power supply voltages via one power supply voltage line VDD2 and gate signals via one gate signal line G2.

Thus, the write timings of the first drive circuits RTR', GTR', and BTR', which are located adjacent to each other in the first direction, and the second drive circuits RTR, GTR, and BTR, which are located adjacent to each other in the first direction, are the same.

Third Embodiment

Next, a third embodiment according to the disclosure will be described with reference to FIGS. 13 to 16. The third embodiment is different from the first and second embodiments in that, the number of display units for bottom emission (resolution of the back side display surface) and the number of display units for top emission (resolution of the front side display surface) are different in a display device 30, and the other details are as described in the first and second embodiments. For the sake of the description, members having the same functions as the members illustrated in the diagrams in the first and second embodiments are denoted by the same reference numerals, and descriptions thereof will be omitted.

Figure 13:
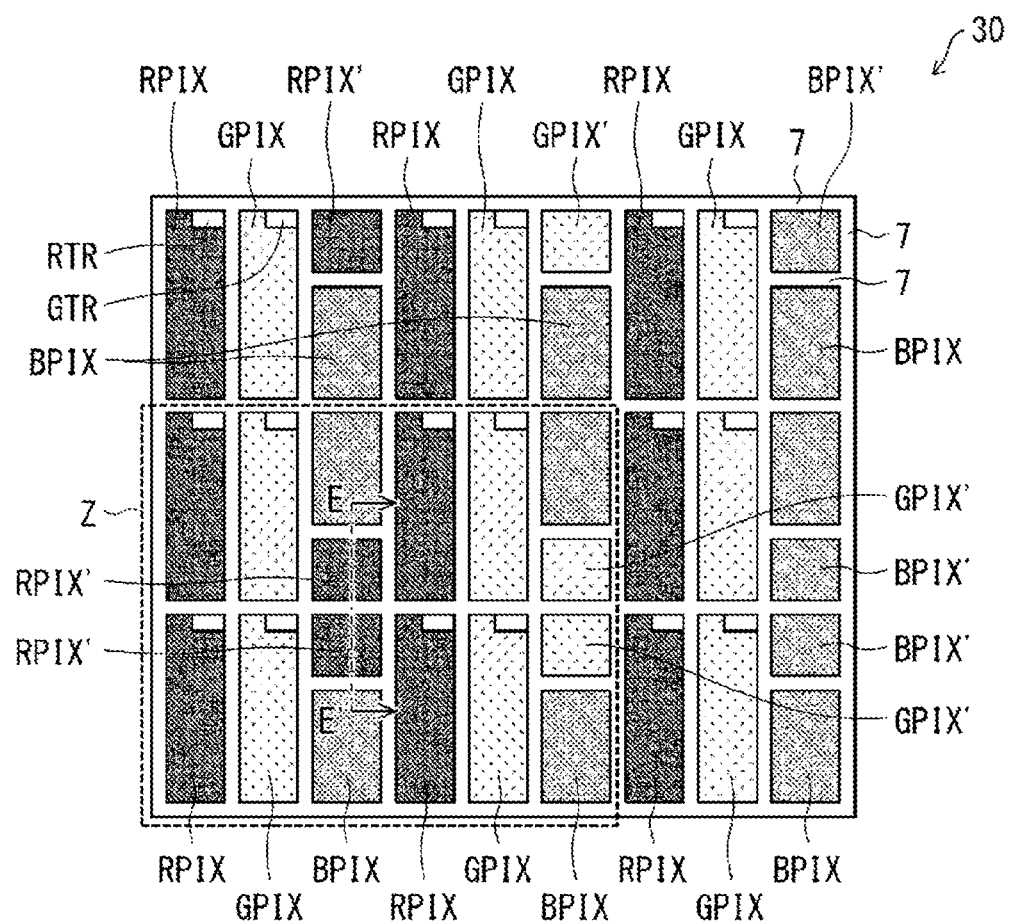
FIG. 13 is a plan view illustrating a display region of a display device according to a third embodiment.

FIG. 13 is a plan view illustrating a display region of the display device 30 according to the third embodiment.

As illustrated in FIG. 13, in a display region of the display device 30, the first light-emitting region including the red pixel RPIX' for BE, the red pixel RPIX for TE, the green pixel GPIX for TE, and the blue pixel BPIX for TE, the second light-emitting region including the green pixel GPIX' for BE, the red pixel RPIX for TE, the green pixel GPIX for TE, and the blue pixel BPIX for TE, and the third light-emitting region including the blue pixel BPIX' for BE, the red pixel RPIX for TE, the green pixel GPIX for TE, and the blue pixel BPIX for TE, are arranged adjacent to each other in the first direction in the figure. Further, a plurality of the first light-emitting regions, a plurality of the second light-emitting regions, and a plurality of the third light-emitting regions are each arranged linearly along the second direction in the figure.

The red pixel RPIX' for BE, the green pixel GPIX' for BE, and the blue pixel BPIX' for BE are one display unit on the back side display surface. The red pixel RPIX for TE, the green pixel GPIX for TE, and the blue pixel BPIX for TE in each of the first light-emitting region, the second light-emitting region, and the third light-emitting region are one display unit on the front side display surface.

In the embodiment, as an example of a case in which the number of display units for top emission and the number of display units for bottom emission are different, a case in which the number of display units for top emission is three times the number of display units for bottom emission, that is, the resolution of the front side display surface is three times the resolution of the back side display surface, will be described. However, without being limited to this example, the number of display units for top emission may be smaller than the number of display units for bottom emission.

Further, in the embodiment, as illustrated in FIG. 13, in the display region of the display device 30, in a case in which a size of each of the red pixel RPIX for TE, the green pixel GPIX for TE, and the blue pixel BPIX for TE, are greater than a size of each of the red pixel RPIX' for BE, the green pixel GPIX' for BE, and the blue pixel BPIX' for BE, and the size of the blue pixel BPIX for TE is greater than the size of the red pixel RPIX for TE and the size of the green pixel GPIX for TE will be described as an example. However, this is just an example. For example, the size of each of the pixels RPIX, GPIX, and BPIX for TE may be the same as the size of each of the pixels RPIX', GPIX', and BPIX' for BE, or the size of each of the pixels RPIX', GPIX', and BPIX' for BE may be greater than the size of each of the pixels RPIX, GPIX, and BPIX for TE.

Further, in the embodiment, as illustrated in FIG. 13, in the display region of the display device 30, a case in which, in the first light-emitting region, the red pixel RPIX' for BE and the blue pixel BPIX for TE are arranged adjacent to each other in the second direction in the figure, in the second light-emitting region, the green pixel GPIX' for BE and the blue pixel BPIX for TE are arranged adjacent to each other in the second direction in the figure, and in the third light-emitting region, the blue pixel BPIX' for BE and the blue pixel BPIX for TE are arranged adjacent to each other in the second direction in the figure, is described as an example. However, this is just an example. For example, in the first light-emitting region, the red pixel RPIX' for BE may be arranged adjacent to any one of the red pixel RPIX for TE, the green pixel GPIX for TE, and the blue pixel BPIX for TE in the second direction in the figure, in the second light-emitting region, the green pixel GPIX' for BE may be arrange adjacent to any one of the red pixel RPIX for TE, the green pixel GPIX for TE, and the blue pixel BPIX for TE in the second direction in the figure, and in the third light-emitting region, the blue pixel BPIX' for BE may be arranged adjacent to any one of the red pixel RPIX for TE, the green pixel GPIX for TE, and the blue pixel BPIX for TE in the second direction in the figure.

Further, as illustrated in FIG. 13, in the display region of the display device 30, the plurality of the first light-emitting regions, the plurality of the second light-emitting regions, and the plurality of the third light-emitting regions are each linearly arranged along the second direction in the figure, in two first light-emitting regions adjacent to each other in the second direction in the figure, two red pixels RPIX' for BE or two blue pixels BPIX for TE are arranged so as to be adjacent to each other, in two second light-emitting regions adjacent to each other in the second direction in the figure, two green pixels GPIX' for BE or two blue pixels BPIX for TE are arranged so as to be adjacent to each other, and in two third light-emitting regions adjacent to each other in the second direction in the figure, two blue pixels BPIX' for BE or two blue pixels BPIX for TE are arranged so as to be adjacent to each other.

Figure 14:
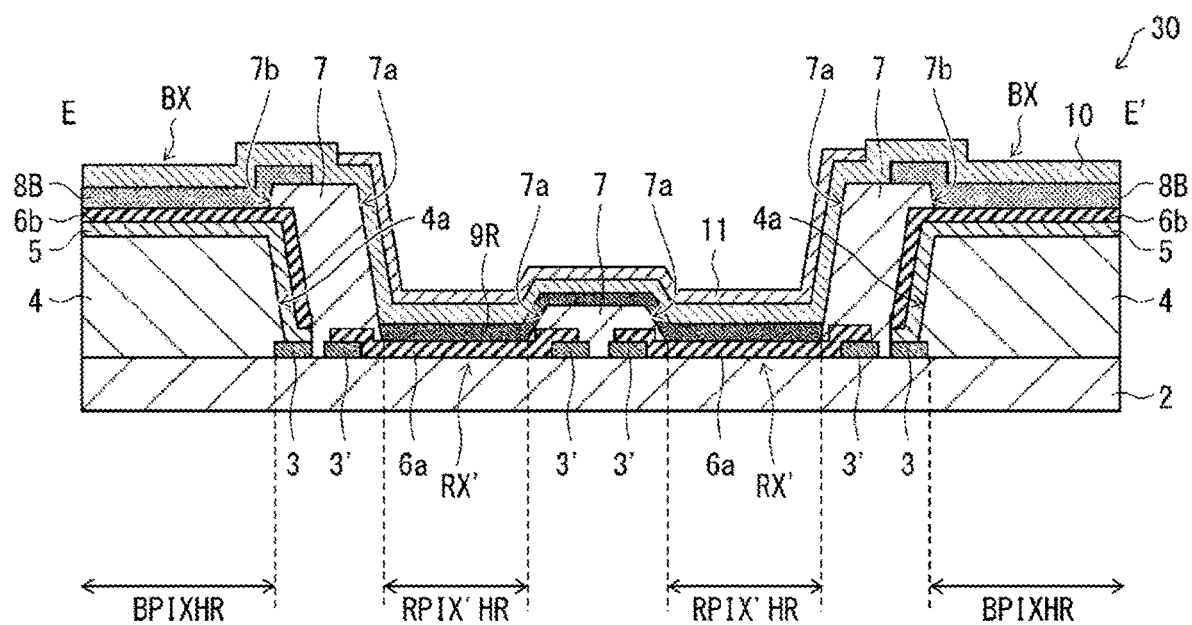
FIG. 14 is a cross-sectional view taken along a line E-E' of the display device according to the third embodiment illustrated in FIG. 13.

FIG. 14 is a cross-sectional view taken along a line E-E' of the display device 30 illustrated in FIG. 13.

As illustrated in FIG. 14, a light-emitting region RPIX'HR of the first red light-emitting element (first light-emitting element) RX' is a region in which the transparent conductor 6a, which is the island-shaped first pixel electrode, the red light-emitting layer (first light-emitting layer) 9R, and the transparent conductor 10, which is the common electrode (first common electrode), provided in the first red light-emitting element (first light-emitting element) RX', overlap, and corresponds to the red pixel RPIX' for BE illustrated in FIG. 13. Further, a light-emitting region BPIXHR of the second blue light-emitting element (second light-emitting element) BX is a region in which the transparent conductor 6b, which is the island-shaped second pixel electrode, the blue light-emitting layer (second light-emitting layer) 8B, and the transparent conductor 10, which is the common electrode (second common electrode), provided in the second blue light-emitting element (second light-emitting element) BX, overlap, and corresponds to the blue pixel BPIX for TE illustrated in FIG. 13.

Although not illustrated in the figure, similarly, a light-emitting region of the first green light-emitting element (first light-emitting element) corresponds to the green pixel GPIX' for BE illustrated in FIG. 13, a light-emitting region of the first blue light-emitting element (first light-emitting element) corresponds to the blue pixel BPIX' for BE illustrated in FIG. 13, a light-emitting region of the second red light-emitting element (second light-emitting element) corresponds to the red pixel RPIX for TE illustrated in FIG. 13, and a light-emitting region of the second green light-emitting element (second light-emitting element) corresponds to the green pixel GPIX for TE illustrated in FIG. 13.

As illustrated in FIGS. 13 and 14, among the plurality of the first light-emitting elements RX', GX', and BX', two first light-emitting elements RX', GX', and BX', which include the light-emitting layers having the same color and are adjacent to each other in the second direction in FIG. 13, that is, two first red light-emitting elements RX' adjacent to each other in the second direction in FIG. 13, are provided in one opening 4a provided in the flattened layer 4. Although not illustrated in the figure, each of two adjacent first green light-emitting elements GX' in the second direction in FIG. 13 and two adjacent first blue light-emitting elements BX' in the second direction in FIG. 13 is also provided in one opening 4a provided in the flattened layer 4.

Figure 15:
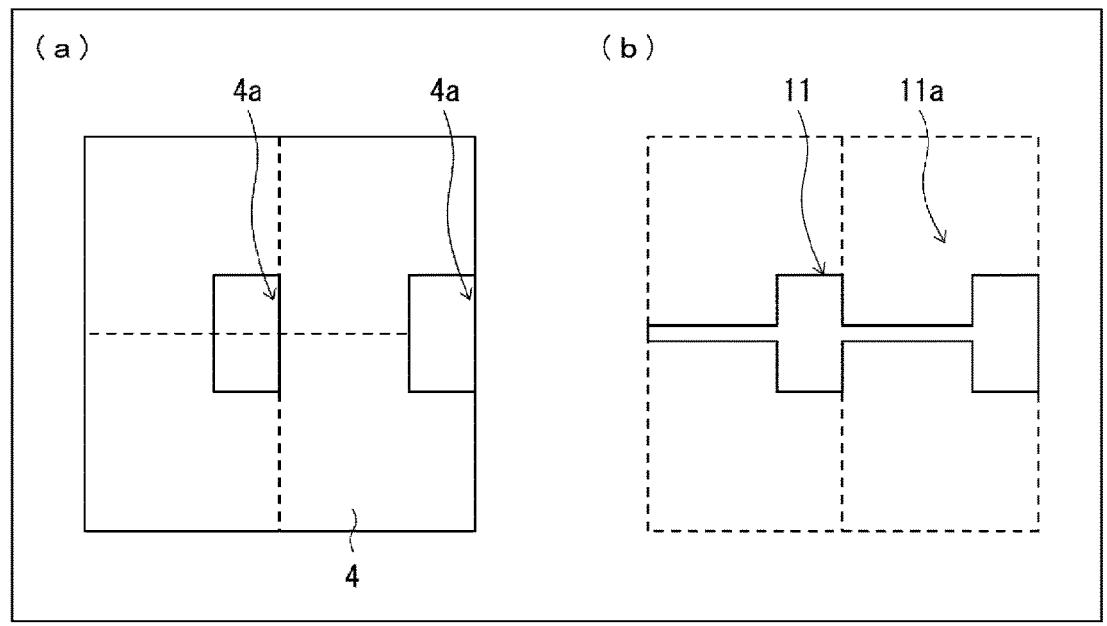
FIG. 15(a) is a diagram illustrating a shape of a flattened layer formed in a part of the display region of the display device according to the third embodiment illustrated in FIGS. 13 and 14.
FIG. 15(b) is a diagram illustrating a shape of a first light blocking member formed in a part of the display region of the display device according to the third embodiment illustrated in FIGS. 13 and 14.

(a) of FIG. 15 is a diagram illustrating a shape of the flattened layer 4 formed in a part of the display region of the display device 30, and (b) of FIG. 15 is a diagram illustrating a shape of the first light blocking member 11 formed in a part of the display region of the display device 30.

As described above, in the display region of the display device 30, each of the two first light-emitting elements RX', GX', and BX', which include the light-emitting layers having the same color and are adjacent to each other in the second direction in FIG. 13, are provided in one opening 4a provided in the flattened layer 4. Thus, as illustrated in (a) of FIG. 15, in the flattened layer 4, the openings 4a have shapes such that the two first light-emitting elements RX', GX', and BX' can be provided, respectively.

Further, each of the two first light-emitting elements RX', GX', and BX', which include the light-emitting layers having the same color and are adjacent to each other in the second direction in FIG. 13 in one opening 4a provided in the flattened layer 4. Thus, as illustrated in (b) of FIG. 15, the first light blocking member 11 is formed so as to cover at least the openings 4a in the flattened layer 4 illustrated in (a) of FIG. 15, and is formed so that the portions of the first light blocking member 11 that covers the openings 4a are connected in the right-left direction in the figure.

As described above, when each of two first light-emitting elements RX', GX', and BX', which include light-emitting layers having the same color and are adjacent to each other in the second direction in FIG. 13, are provided in one opening 4a provided in the flattened layer 4, for example, each of the steps of coating the light-emitting layers can be facilitated.

According to the display device 30, the front side display surface can be large in area, high in definition, and brightened, so that the display image quality of the front side display surface can be maintained at the same level as the display image quality of the single-sided display device in the related art. Thus, it is possible to achieve a double-sided display device further including a back side display surface while maintaining the display image quality of the front side display surface.

Figure 16:
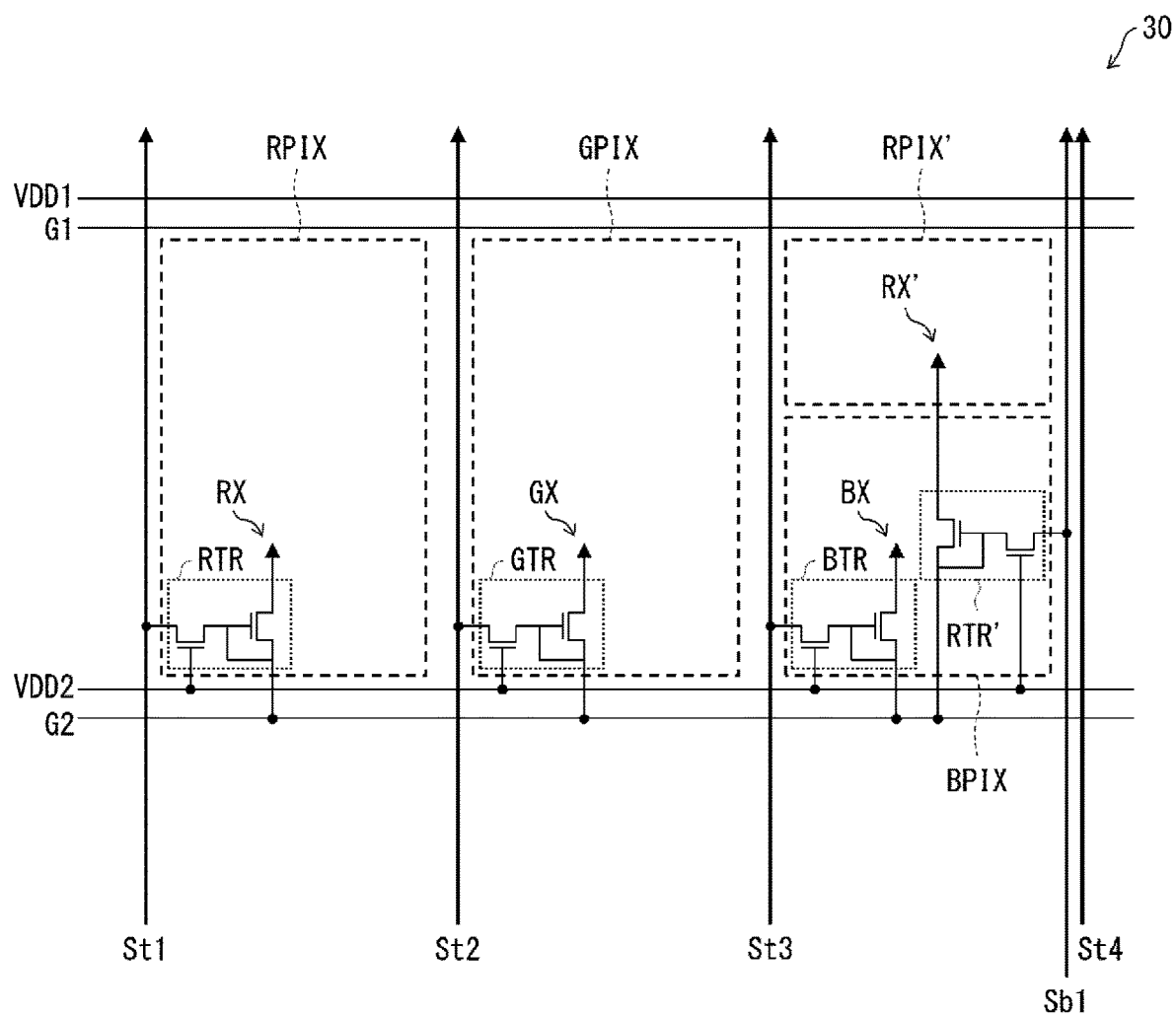
FIG. 16 is a diagram illustrating a configuration example of a circuit of the display device according to the third embodiment.

FIG. 16 is a diagram illustrating a configuration example of a circuit of the display device 30.

As illustrated in FIG. 16, in the display device 30, the first drive circuit RTR' that controls the light emission intensity of the first red light-emitting element RX' is provided below the blue pixel BPIX for TE. This is because, as described above, in the display device 30, the size of the blue pixel BPIX for TE is greater than the size of the red pixel RPIX for TE and the size of the green pixel GPIX for TE.

As illustrated in FIG. 16, the second red light-emitting element (second light-emitting element) RX is provided in a region surrounded by the power supply voltage line VDD1 and the gate signal line G1, the power supply voltage line VDD2 and the gate signal line G2, the second source line St1, and the second source line St2. Further, the second green light-emitting element (second light-emitting element) GX is provided in a region surrounded by the power supply voltage line VDD1 and the gate signal line G1, the power supply voltage line VDD2 and the gate signal line G2, the second source line St2, and the second source line St3. Furthermore, the first red light-emitting element (first light-emitting element) RX' and the second blue light-emitting element (second light-emitting element) BX are provided in a region surrounded by the power supply voltage line VDD1 and the gate signal line G1, the power supply voltage line VDD2 and the gate signal line G2, the second source line St3, and the first source line Sb1 and the second source line St4.

Thus, in the display device 30, the number of second source lines St1, St2 . . . is three times the number of first source lines Sb1, Sb2 . . . , so that only the first source line Sb1 and the second source line St4 are arranged adjacent to each other.

Further, the power supply voltage lines VDD1, VDD2 . . . , and the gate signal lines G1, G2 . . . extend in the right-left direction in the figure, and this extending direction is the first direction.

The first drive circuits RTR', GTR', and BTR', which are located adjacent to each other in the first direction, and the second drive circuits RTR, GTR, and BTR, which are located adjacent to each other in the first direction, are each supplied with power supply voltages via one power supply voltage line VDD2 and gate signals via one gate signal line G2.

Thus, the write timings of the first drive circuits RTR', GTR', and BTR', which are located adjacent to each other in the first direction, and the second drive circuits RTR, GTR, and BTR, which are located adjacent to each other in the first direction, are the same.

Fourth Embodiment

Next, a fourth embodiment of the disclosure will be described with reference to FIG. 17. Display devices 40, 50, and 60 according to the embodiment are different from the first to third embodiments in that the display devices 40, 50, and 60 include optical members 41, 51, and 61 including color conversion layers 42 and 43, 52, 53, and 54, and 62, 63, and 64, respectively, and the other details are as described in the first to third embodiments. For convenience of description, members having the same functions as those of the members illustrated in the drawings in the first to third embodiments are denoted by the same reference numerals, and descriptions thereof will be omitted.

Figure 17:
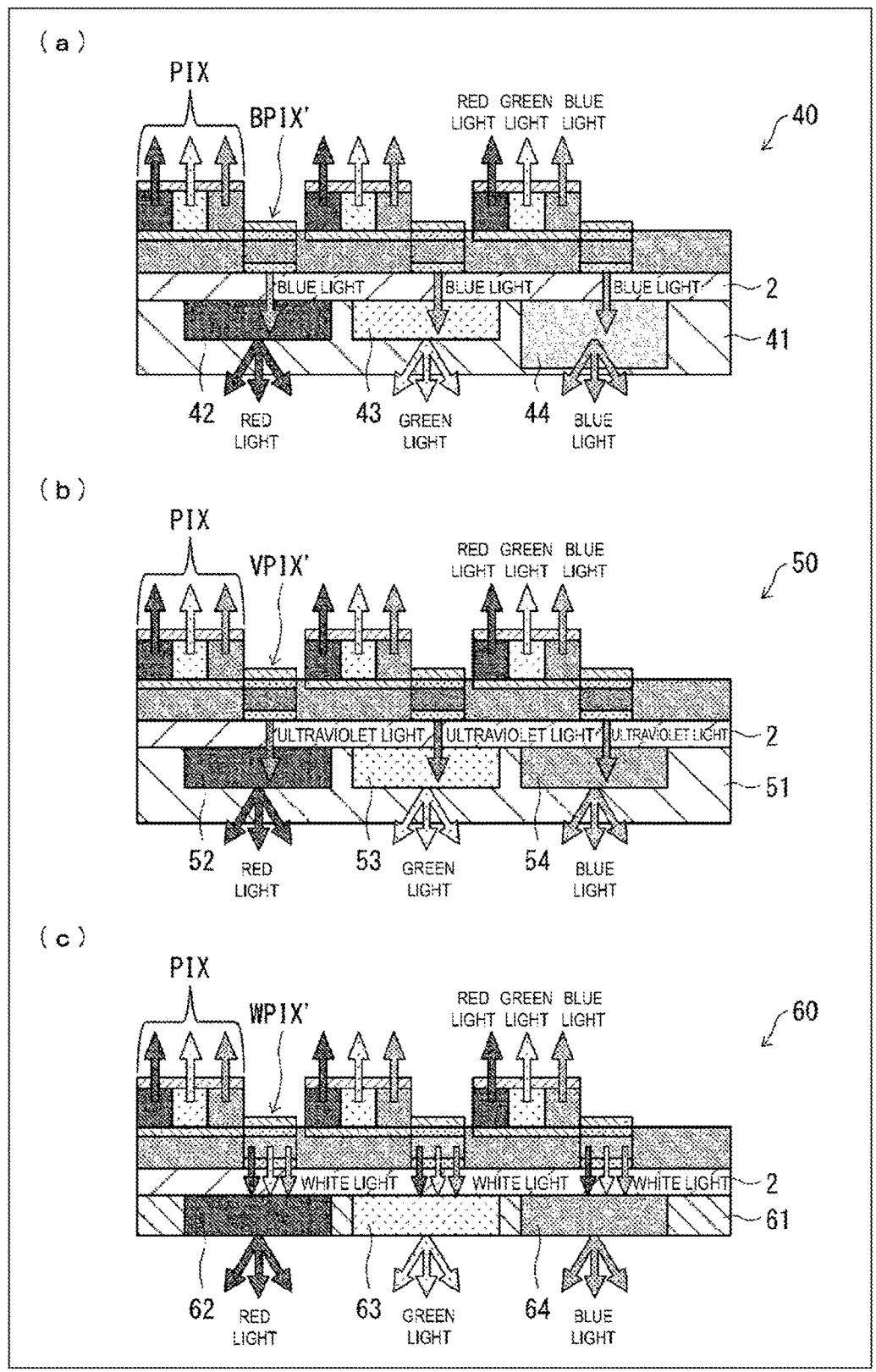
FIG. 17(a) is a diagram illustrating a schematic configuration of a display device according to a fourth embodiment including an optical member including color conversion layers and a scattering layer.
FIG. 17(b) is a diagram illustrating a schematic configuration of another display device according to the fourth embodiment including an optical member including color conversion layers.
FIG. 17(c) is a diagram illustrating a schematic configuration of still another display device according to the fourth embodiment including an optical member including color filter layers.

(a) of FIG. 17 is a diagram illustrating a schematic configuration of the display device 40 including the optical member 41 including the color conversion layers 42 and 43 and a scattering layer 44. (b) of FIG. 17 is a diagram illustrating a schematic configuration of the display device 50 including the optical member 51 including the color conversion layers 52, 53, and 54. (c) of FIG. 17 is a diagram illustrating a schematic configuration of the display device 60 including the optical member 61 including color filter layers as the color conversion layers 62, 63, and 64.

As illustrated in (a) of FIG. 17, the display device 40 includes a pixel PIX for TE including a light-emitting region of a second red light-emitting element (second light-emitting element), a light-emitting region of a second green light-emitting element (second light-emitting element), and a light-emitting region of a second blue light-emitting element (second light-emitting element), and the blue pixel BPIX' for BE including a light-emitting region of the first blue light-emitting element (first light-emitting element) BX'.

Then, since light from the light-emitting region of the first blue light-emitting element (first light-emitting element) is taken out through the substrate 2, the optical member 41 including the color conversion layers 42 and 43 and the scattering layer 44 is provided on a side of the substrate 2 opposite to the surface on which the first light-emitting element, the flattened layer, and the second light-emitting element are formed.

The optical member 41 includes the color conversion layer 42 for converting light from the light-emitting region of the first blue light-emitting element (first light-emitting element) to red, the color conversion layer 43 for converting light from the light-emitting region of the first blue light-emitting element (first light-emitting element) to green, the scattering layer 44 for scattering light from the light-emitting region of the first blue light-emitting element (first light-emitting element), and an absorption layer for absorbing light in a wavelength range from ultraviolet light to blue light. Note that, in the optical member 41, a part other than the color conversion layers 42 and 43 and the scattering layer 44 is the absorption layer.

Thus, the display device 40 includes only the blue pixel BPIX' for BE as the pixel for BE, but enables full color display on the back side display surface of the display device 40.

As illustrated in (b) of FIG. 17, the display device 50 includes the pixel PIX for TE including the light-emitting region of the second red light-emitting element (second light-emitting element), the light-emitting region of the second green light-emitting element (second light-emitting element), and the light-emitting region of the second blue light-emitting element (second light-emitting element), and an ultraviolet light pixel VPIX' for BE including a light-emitting region of a first UV light (ultraviolet light) emitting element (first light-emitting element).

Then, since light from the light-emitting region of the first UV light (ultraviolet light) emitting element (first light-emitting element) is taken out through the substrate 2, the optical member 51 including the color conversion layers 52, 53, and 54 is provided on a side of the substrate 2 opposite to the surface on which the first light-emitting element, the flattened layer, and the second light-emitting element are formed.

The optical member 51 includes the color conversion layer 52 for converting light from the light-emitting region of the first UV light (ultraviolet light) emitting element (first light-emitting element) to red, the color conversion layer 53 for converting light from the light-emitting region of the first UV light (ultraviolet light) emitting element (first light-emitting element) to green, the color conversion layer 54 for converting light from the light-emitting region of the first UV light (ultraviolet light) emitting element (first light-emitting element) to blue, and an absorption layer absorbing light in a wavelength range of ultraviolet light. Note that, in the optical member 51, a part other than the color conversion layers 52, 53, and 54 is the absorption layer.

Thus, the display device 50 includes only the ultraviolet light pixel VPIX' for BE as the pixel for BE, but enables full color display on the back side display surface of the display device 50.

As illustrated in (c) of FIG. 17, the display device 60 includes the pixel PIX for TE including a light-emitting region of a second red light-emitting element (second light-emitting element), a light-emitting region of a second green light-emitting element (second light-emitting element), and a light-emitting region of a second blue light-emitting element (second light-emitting element), and a white light pixel WPIX' for BE including a light-emitting region of a first white light-emitting element (first light-emitting element).

Then, since light from the light-emitting region of the first white light-emitting element (first light-emitting element) is taken out through the substrate 2, the optical member 61 including the color filter layers as the color conversion layers 62, 63, and 64 is provided on a side of the substrate 2 opposite to the surface on which the first light-emitting element, the flattened layer, and the second light-emitting element are formed.

The optical member 61 includes the color conversion layer (red color filter layer) 62 that takes out only red from light emitted from the light-emitting region of the first white light-emitting element (first light-emitting element), the color conversion layer (green color filter layer) 63 that takes out only green from light emitted from the light-emitting region of the first white light-emitting element (first light-emitting element), and the color conversion layer (blue color filter layer) 64 that takes out only blue from light emitted from the light-emitting region of the first white light-emitting element (first light-emitting element).

Thus, the display device 60 includes only the white light pixel WPIX' for BE as the pixel for BE, but enables full color display on the back side display surface of the display device 60.

Note that a material can be selected from fluorescent materials (quantum dots (nanoparticles), fluorescent dye, etc.) as the color conversion layers 42, 43, 52, 53, and 54. When such a fluorescent color conversion layer is used, it is preferable to use an optical member provided on the other side of the substrate 2, which is opposite to the one side of the substrate 2 on which the color conversion layer is provided, as an absorption layer that absorbs the excitation light of the color conversion layer.

Further, as the color conversion layers 62, 63, and 64, absorption color filter layers can be used.

Supplement

First Aspect

A display device including a substrate, a flattened layer formed on one side of the substrate, at least one first light-emitting element, at least one second light-emitting element, at least one first drive circuit configured to control light emission intensity of the first light-emitting element, and at least one second drive circuit configured to control light emission intensity of the second light-emitting element, in which light emitted by the first light-emitting element is taken out through the substrate, light emitted by the second light-emitting element is taken out from a direction opposite to a direction in which the light emitted by the first light-emitting element is taken out, the first light-emitting element is provided in an opening provided in the flattened layer, the second light-emitting element is provided in a layer above the flattened layer and overlaps the flattened layer, and the first drive circuit and the second drive circuit are provided closer to the substrate than the second light-emitting element.

Second Aspect

The display device according to the first aspect, in which the first light-emitting element includes a first pixel electrode having an island shape, a first light-emitting layer, and a first common electrode in order from the substrate side, the second light-emitting element includes a second pixel electrode having an island shape, a second light-emitting layer, and a second common electrode in order from the substrate side, the first light-emitting element includes a first light blocking member on a side of the first light-emitting layer opposite to a substrate side, and the second light-emitting element includes a second light blocking member on the substrate side of the second light-emitting layer.

Third Aspect

The display device according to the second aspect, in which the first common electrode and the second common electrode are made of an optical transparent conductor formed of the same material in the same layer.

Fourth Aspect

The display device according to the second or third aspect, in which the first common electrode and the second common electrode are electrically connected to each other.

Fifth Aspect

The display device according to any one of the second to fourth aspects, in which the first pixel electrode and the second pixel electrode are made of an optical transparent conductor formed of the same material in the same layer.

Sixth Aspect

The display device according to any one of the second to fifth aspects, in which the first light-emitting element includes a first reflective electrode, the first light blocking member is made of a conductor, and the first reflective electrode is an electrode formed by layering the first light blocking member and the first common electrode.

Seventh Aspect

The display device according to any one of the second to sixth aspects, in which the second light-emitting element includes a second reflective electrode, the second light blocking member is made of a conductor, and the second reflective electrode is an electrode formed by layering the second light blocking member and the second pixel electrode.

Eighth Aspect

The display device according to the second aspect, in which the first light blocking member is made of a conductor, and the first common electrode is the first light blocking member.

Ninth Aspect

The display device according to any one of the second to fourth aspects, in which the second light blocking member is made of a conductor, and the second pixel electrode is the second light blocking member.

Tenth Aspect

The display device according to any one of the second to ninth aspects, including a first edge cover overlapping an edge portion of the first pixel electrode, in which the first edge cover has a first opening that overlaps the first pixel electrode, and an edge of the first opening is located inside an edge of the opening in the flattened layer.

Eleventh Aspect

The display device according to any one of the second to ninth aspects, including a first edge cover overlapping an edge portion of the first pixel electrode, in which the first edge cover has a first opening that overlaps the first pixel electrode, and an edge of the first opening is located outside an edge of the opening in the flattened layer.

Twelfth Aspect

The display device according to any one of the second to eleventh aspects, including a second edge cover overlapping an edge portion of the second pixel electrode, in which the second edge cover has a second opening that overlaps the second pixel electrode, and an edge of the second opening overlaps the flattened layer.

Thirteenth Aspect

The display device according to any one of the second to twelfth aspects, including a first edge cover overlapping an edge portion of the first pixel electrode, and a second edge cover overlapping an edge portion of the second pixel electrode, in which the first edge cover and the second edge cover are one edge cover layer formed of the same material in the same layer.

Fourteenth Aspect

The display device according to any one of the second to thirteenth aspects, including a first edge cover overlapping an edge portion of the first pixel electrode, in which the first edge cover has a first opening that overlaps the first pixel electrode, and the first light blocking member completely overlaps at least the first opening.

Fifteenth Aspect

The display device according to any one of the second to fourteenth aspects, in which at least one of the first light blocking member and the second light blocking member has visible light reflectivity.

Sixteenth Aspect

The display device according to any one of the second to fifteenth aspects, in which the first light-emitting layer and the second light-emitting layer are light-emitting layers formed of different materials from each other.

Seventeenth Aspect

The display device according to any one of the second to fifteenth aspects, in which the first light-emitting layer and the second light-emitting layer are light-emitting layers formed of the same material in the same layer.

Eighteenth Aspect

The display device according to any one of the second to seventeenth aspects, in which the at least one first light-emitting element comprises a plurality of the first light-emitting elements, the at least one second light-emitting element comprises a plurality of the second light-emitting elements, the at least one first drive circuit comprises a plurality of the first drive circuits, the at least one second drive circuit comprises a plurality of the second drive circuits, the plurality of the first light-emitting elements are provided in a plurality of the openings provided in the flattened layer, respectively, the plurality of the second light-emitting elements are provided in a layer above the flattened layer and overlap the flattened layer, the plurality of the first drive circuits and the plurality of the second drive circuits are provided closer to the substrate than the plurality of the second light-emitting elements, the plurality of the first light-emitting elements include a first red light-emitting element including a red light-emitting layer as the first light-emitting layer, a first green light-emitting element including a green light-emitting layer as the first light-emitting layer, and a first blue light-emitting element including a blue light-emitting layer as the first light-emitting layer, the plurality of the second light-emitting elements include a second red light-emitting element including a red light-emitting layer as the second light-emitting layer, a second green light-emitting element including a green light-emitting layer as the second light-emitting layer, and a second blue light-emitting element including a blue light-emitting layer as the second light-emitting layer, a first light-emitting region including the first red light-emitting element and the second red light-emitting element, a second light-emitting region including the first green light-emitting element and the second green light-emitting element, and a third light-emitting region including the first blue light-emitting element and the second blue light-emitting element, are arranged adjacent to each other in a first direction that is an extending direction of a gate signal line, the first red light-emitting element, the first green light-emitting element, and the first blue light-emitting element are one display unit of light taken out through the substrate, and the second red light-emitting element, the second green light-emitting element, and the second blue light-emitting element are one display unit of light taken out from the direction opposite to the direction in which the light emitted by the first light-emitting element is taken out.

Nineteenth Aspect

The display device according to the eighteenth aspect, in which in the first direction, the first light-emitting element is adjacent to the second light-emitting element including a light-emitting layer having a different color.

Twentieth Aspect

The display device according to the eighteenth aspect, in which in the first direction, the first light-emitting element is adjacent to the first light-emitting element including a light-emitting layer having a different color, and the second light-emitting element is adjacent to the second light-emitting element including a light-emitting layer having a different color.

Twenty-First Aspect

The display device according to any one of the eighteenth to twentieth aspects, in which a plurality of the first light-emitting regions, a plurality of the second light-emitting regions, and a plurality of the third light-emitting regions are each arranged linearly along a second direction orthogonal to the first direction.

Twenty-Second Aspect

The display device according to any one of second to seventeenth aspects, in which the at least one first light-emitting element comprises a plurality of the first light-emitting elements, the at least one second light-emitting element comprises a plurality of the second light-emitting elements, the at least one first drive circuit comprises a plurality of the first drive circuits, the at least one second drive circuit comprises a plurality of the second drive circuits, the plurality of the first light-emitting elements are provided in a plurality of the openings provided in the flattened layer, respectively, the plurality of the second light-emitting elements are provided in a layer above the flattened layer and overlap the flattened layer, the plurality of the first drive circuits and the plurality of the second drive circuits are provided closer to the substrate than the plurality of the second light-emitting elements, the plurality of the first light-emitting elements include a first red light-emitting element including a red light-emitting layer as the first light-emitting layer, a first green light-emitting element including a green light-emitting layer as the first light-emitting layer, and a first blue light-emitting element including a blue light-emitting layer as the first light-emitting layer, the plurality of the second light-emitting elements include a second red light-emitting element including a red light-emitting layer as the second light-emitting layer, a second green light-emitting element including a green light-emitting layer as the second light-emitting layer, and a second blue light-emitting element including a blue light-emitting layer as the second light-emitting layer, a first light-emitting region including the first red light-emitting element, the second red light-emitting element, the second green light-emitting element, and the second blue light-emitting element, a second light-emitting region including the first green light-emitting element, the second red light-emitting element, the second green light-emitting element, and the second blue light-emitting element, and a third light-emitting region including the first blue light-emitting element, the second red light-emitting element, the second green light-emitting element, and the second blue light-emitting element, are arranged adjacent to each other in a first direction that is an extending direction of a gate signal line, the first red light-emitting element, the first green light-emitting element, and the first blue light-emitting element are one display unit of light taken out through the substrate, and the second red light-emitting element, the second green light-emitting element, and the second blue light-emitting element in each of the first light-emitting region, the second light-emitting region, and the third light-emitting region are one display unit of light taken out from the direction opposite to the direction in which the light emitted by the first light-emitting element is taken out.

Twenty-Third Aspect

The display device according to the twenty-second aspect, in which in the first light-emitting region, the first red light-emitting element and a light-emitting element having a specific color selected from the second red light-emitting element, the second green light-emitting element, and the second blue light-emitting element, are arranged adjacent to each other in a second direction orthogonal to the first direction, in the second light-emitting region, the first green light-emitting element and the light-emitting element having the specific color are arranged adjacent to each other in the second direction, and in the third light-emitting region, the first blue light-emitting element and the light-emitting element having the specific color are arranged adjacent to each other in the second direction.

Twenty-Fourth Aspect

The display device according to the twenty-third aspect, in which of a plurality of the first light-emitting regions, a plurality of the second light-emitting regions, and a plurality of the third light-emitting regions are each arranged linearly along the second direction orthogonal to the first direction, among the plurality of the first light-emitting elements, two first light-emitting elements including light-emitting layers having the same color and adjacent to each other in the second direction are provided in one of the plurality of openings provided in the flattened layer.

Twenty-Fifth Aspect

The display device according to any one of the first to seventeenth aspects, including a color conversion layer provided on a side of the substrate opposite to a surface on which the flattened layer is formed, in which the at least one first light-emitting element comprises a plurality of the first light-emitting elements, each of the plurality of the first light-emitting elements emits light in the same wavelength range, and the color conversion layer is configured to convert a color of light emitted by one or more of the plurality of the first light-emitting elements and take out at least two different colors of light from the light emitted by each of the plurality of first light-emitting elements.

Twenty-Sixth Aspect

The display device according to any one of the first to twenty-fifth aspects, in which a size of a light-emitting region in the first light-emitting element is smaller than a size of a light-emitting region in the second light-emitting element.

Twenty-Seventh Aspect

The display device according to any one of the first to twenty-sixth aspects, in which the first drive circuit and the second drive circuit are driven independently of each other.

Twenty-Eighth Aspect

The display device according to any one of the first to twentieth, twenty-second, twenty-third, and twenty-fifth aspects, the display device including a first source line configured to input a first signal to the first drive circuit, and a second source line configured to input a second signal to the second drive circuit, in which the first light-emitting element and the second light-emitting element are formed adjacent to each other between the first source line and the second source line in a second direction that is an extending direction of the first source line and the second source line.

Twenty-Ninth Aspect

The display device according to any one of the first to twentieth, twenty-second, twenty-third, twenty-fifth, and twenty-eighth aspects, in which each of the first drive circuit and the second drive circuit is supplied with a power supply voltage via one power supply voltage line and a gate signal via one gate signal line.

APPENDIX

The disclosure is not limited to each of the embodiments described above, and various modifications may be made within the scope of the claims. Embodiments obtained by appropriately combining technical approaches disclosed in each of the different embodiments also fall within the technical scope of the disclosure. Furthermore, novel technical features can be formed by combining the technical approaches disclosed in each of the embodiments.

INDUSTRIAL APPLICABILITY

The disclosure can be utilized for a display device.

The invention claimed is:
1. A display device comprising:
a substrate;
a flattened layer formed on one side of the substrate;
at least one first light-emitting element;
at least one second light-emitting element;
at least one first drive circuit configured to control a light emission intensity of the at least one first light-emitting element; and
at least one second drive circuit configured to control a light emission intensity of the at least one second light-emitting element,
wherein light emitted by the at least one first light-emitting element is emitted out through the substrate,
light emitted by the at least one second light-emitting element is emitted out from a direction opposite a direction in which the light emitted by the at least one first light-emitting element is emitted out,
the at least one first light-emitting element is provided in an opening provided in the flattened layer,
the at least one second light-emitting element is provided in a layer above the flattened layer and overlaps the flattened layer,
the at least one first drive circuit and the at least one second drive circuit are provided closer to the substrate than to the at least one second light-emitting element,
the at least one first light-emitting element includes a first pixel electrode having an island shape, a first light-emitting layer, and a first common electrode in this order from a substrate side,
the at least one second light-emitting element includes a second pixel electrode having an island shape, a second light-emitting layer, and a second common electrode in this order from the substrate side,
the at least one first light-emitting element further includes a first light blocking member on a side of the first light-emitting layer opposite a substrate side of the first light-emitting layer,
the at least one second light-emitting element further includes a second light blocking member on a substrate side of the second light-emitting layer,
the at least one first light-emitting element comprises a plurality of first light-emitting elements,
the at least one second light-emitting element comprises a plurality of second light-emitting elements,
the at least one first drive circuit comprises a plurality of first drive circuits,
the at least one second drive circuit comprises a plurality of second drive circuits,
the plurality of first light-emitting elements is provided in a plurality of openings, including the opening, provided in the flattened layer, respectively,
the plurality of second light-emitting elements is provided in the layer above the flattened layer and overlaps the flattened layer,
the plurality of first drive circuits and the plurality of second drive circuits are provided closer to the substrate than to the plurality of second light-emitting elements,
the plurality of first light-emitting elements includes a first red light-emitting element including a red light-emitting layer as the first light-emitting layer, a first green light-emitting element including a green light-emitting layer as the first light-emitting layer, and a first blue light-emitting element including a blue light-emitting layer as the first light-emitting layer,
the plurality of second light-emitting elements include a second red light-emitting element including a red light-emitting layer as the second light-emitting layer, a second green light-emitting element including a green light-emitting layer as the second light-emitting layer, and a second blue light-emitting element including a blue light-emitting layer as the second light-emitting layer,
a first light-emitting region including the first red light-emitting element, the second red light-emitting element, the second green light-emitting element, and the second blue light-emitting element, a second light-emitting region including the first green light-emitting element, the second red light-emitting element, the second green light-emitting element, and the second blue light-emitting element, and a third light-emitting region including the first blue light-emitting element, the second red light-emitting element, the second green light-emitting element, and the second blue light-emitting element, are arranged adjacent to each other in a first direction that is an extending direction of a gate signal line,
the first red light-emitting element, the first green light-emitting element, and the first blue light-emitting element are one display unit of light emitted out through the substrate,
the second red light-emitting element, the second green light-emitting element, and the second blue light-emitting element in each of the first light-emitting region, the second light-emitting region, and the third light-emitting region are one display unit of light emitted out from the direction opposite the direction in which the light emitted by the first light-emitting element is emitted out, in the first light-emitting region, the first red light-emitting element and a light-emitting element having a specific color selected from the second red light-emitting element, the second green light-emitting element, and the second blue light-emitting element, are arranged adjacent to each other in a second direction orthogonal to the first direction, in the second light-emitting region, the first green light-emitting element and the light-emitting element having the specific color are arranged adjacent to each other in the second direction, in the third light-emitting region, the first blue light-emitting element and the light-emitting element having the specific color are arranged adjacent to each other in the second direction, a plurality of first light-emitting regions, including the first light-emitting region, a plurality of second light-emitting regions, including the second light-emitting region, and a plurality of third light-emitting regions, including third light-emitting region, are each arranged linearly along the second direction, and among the plurality of first light-emitting elements, two first light-emitting elements including light-emitting layers having the same color and adjacent to each other in the second direction are provided in one of the plurality of openings provided in the flattened layer.

2. The display device according to claim 1, wherein the first common electrode and the second common electrode are made of an optical transparent conductor formed of the same material in the same layer.

3. The display device according to claim 1, wherein the first common electrode and the second common electrode are electrically connected to each other.

4. The display device according to claim 1, wherein the first pixel electrode and the second pixel electrode are made of an optical transparent conductor formed of the same material in the same layer.

5. The display device according to claim 1, wherein the at least one first light-emitting element further includes a first reflective electrode,
the first light blocking member is made of a conductor, and
the first reflective electrode is an electrode formed by layering the first light blocking member and the first common electrode.

6. The display device according to claim 1, wherein the at least one second light-emitting element further includes a second reflective electrode,
the second light blocking member is made of a conductor, and
the second reflective electrode is an electrode formed by layering the second light blocking member and the second pixel electrode.

7. The display device according to claim 1, wherein the first light blocking member is made of a conductor, and
the first common electrode is the first light blocking member.

8. The display device according to claim 1, wherein the second light blocking member is made of a conductor, and
the second pixel electrode is the second light blocking member.

9. The display device according to claim 1, further comprising:
a first edge cover overlapping an edge portion of the first pixel electrode,
wherein the first edge cover has a first opening that overlaps the first pixel electrode, and
an edge of the first opening is located inside an edge of the opening in the flattened layer.

10. The display device according to claim 1, further comprising:
a second edge cover overlapping an edge portion of the second pixel electrode,
wherein the second edge cover has a second opening that overlaps the second pixel electrode, and
an edge of the second opening overlaps the flattened layer.

11. The display device according to claim 1, further comprising:
a first edge cover overlapping an edge portion of the first pixel electrode; and
a second edge cover overlapping an edge portion of the second pixel electrode,
wherein the first edge cover and the second edge cover are one edge cover layer formed of the same material in the same layer.

12. The display device according to claim 1, further comprising:
a first edge cover overlapping an edge portion of the first pixel electrode,
wherein the first edge cover has a first opening that overlaps the first pixel electrode, and
the first light blocking member completely overlaps at least the first opening.

13. A display device comprising:
a substrate;
a flattened layer formed on one side of the substrate;
at least one first light-emitting element;
at least one second light-emitting element;
at least one first drive circuit configured to control a light emission intensity of the at least one first light-emitting element;
at least one second drive circuit configured to control a light emission intensity of the at least one second light-emitting element; and
a color conversion layer provided on a side of the substrate opposite a surface on which the flattened layer is formed,
wherein light emitted by the at least one first light-emitting element is emitted out through the substrate,
light emitted by the at least one second light-emitting element is emitted out from a direction opposite a direction in which the light emitted by the at least one first light-emitting element is emitted out,
the at least one first light-emitting element is provided in an opening provided in the flattened layer,
the at least one second light-emitting element is provided in a layer above the flattened layer and overlaps the flattened layer,
the at least one first drive circuit and the at least one second drive circuit are provided closer to the substrate than to the at least one second light-emitting element,
the at least one first light-emitting element comprises a plurality of first light-emitting elements,
each of the plurality of first light-emitting elements emits light in the same wavelength range, and
the color conversion layer is configured to convert a color of light emitted by one or more of the plurality of first light-emitting elements and to emit out at least two different colors of light from the light emitted by each of the plurality of first light-emitting elements.

14. The display device according to claim 1,
wherein a size of a light-emitting region in the at least one first light-emitting element is smaller than a size of a light-emitting region in the at least one second light-emitting element.

15. The display device according to claim 13,
wherein the at least one first light-emitting element includes a first pixel electrode having an island shape, a first light-emitting layer, and a first common electrode in this order from a substrate side,
the at least one second light-emitting element includes a second pixel electrode having an island shape, a second light-emitting layer, and a second common electrode in this order from the substrate side,
the at least one first light-emitting element further includes a first light blocking member on a side of the first light-emitting layer opposite a substrate side of the first light-emitting layer, and
the at least one second light-emitting element further includes a second light blocking member on a substrate side of the second light-emitting layer.

16. The display device according to claim 15,
wherein the first common electrode and the second common electrode are made of an optical transparent conductor formed of the same material in the same layer.

17. The display device according to claim 15,
wherein the first common electrode and the second common electrode are electrically connected to each other.

18. The display device according to claim 15,
wherein the first pixel electrode and the second pixel electrode are made of an optical transparent conductor formed of the same material in the same layer.

19. The display device according to claim 15,
wherein the at least one first light-emitting element further includes a first reflective electrode,
the first light blocking member is made of a conductor, and
the first reflective electrode is an electrode formed by layering the first light blocking member and the first common electrode.

20. The display device according to claim 15,
wherein the at least one second light-emitting element further includes a second reflective electrode,
the second light blocking member is made of a conductor, and
the second reflective electrode is an electrode formed by layering the second light blocking member and the second pixel electrode.

* * * * *